United States Patent
Lu et al.

(10) Patent No.: US 10,235,294 B1
(45) Date of Patent: Mar. 19, 2019

(54) PRE-READ VOLTAGE PULSE FOR FIRST READ ERROR HANDLING

(71) Applicant: SanDisk Technologies LLC, Plano, TX (US)

(72) Inventors: Ching-Huang Lu, Fremont, CA (US); Swaroop Kaza, San Jose, CA (US); Piyush Sagdeo, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/959,445

(22) Filed: Apr. 23, 2018

(51) Int. Cl.
| | |
|---|---|
| *G11C 11/34* | (2006.01) |
| *G06F 12/0866* | (2016.01) |
| *G11C 16/34* | (2006.01) |
| *G06F 12/02* | (2006.01) |

(52) U.S. Cl.
CPC ...... *G06F 12/0866* (2013.01); *G06F 12/0246* (2013.01); *G11C 16/3436* (2013.01)

(58) Field of Classification Search
CPC ............. G06F 12/0866; G06F 12/0246; G11C 16/3436
USPC .................................................... 136/185.09
See application file for complete search history.

(56) References Cited

U.S. PATENT DOCUMENTS

| | | | |
|---|---|---|---|
| 6,751,146 B1 | 6/2004 | Wang et al. | |
| 9,355,721 B2 * | 5/2016 | Yoon | G11C 13/0069 |
| 2014/0104923 A1 * | 4/2014 | Baek | G11C 13/0069 |
| | | | 365/148 |
| 2017/0301403 A1 | 10/2017 | Pang et al. | |

OTHER PUBLICATIONS

U.S. Appl. No. 15/440,185, filed Feb. 23, 2017 by Alrod et al.
U.S. Appl. No. 15/451,186, filed Mar. 6, 2017 by Dutta et al.

* cited by examiner

*Primary Examiner* — Vu A Le
(74) *Attorney, Agent, or Firm* — Vierra Magen Marcus LLP

(57) ABSTRACT

Apparatuses and techniques are described for performing a pre-read operation in preparation for a read operation in a memory device. The pre-read operation transitions the memory cells from a first read condition to a second read condition so that their threshold voltages will be in a desired, predictable range when the read occurs. The pre-read operation can involve maintaining voltages on a selected word line and unselected word lines at specified levels and for a specified duration which is relatively long compared to a duration of the read operation. The word line voltages, in combination with bit line and source line voltages, provide the channels of a NAND string in a conductive state and gradually transitions the memory cells to the second read condition.

20 Claims, 18 Drawing Sheets

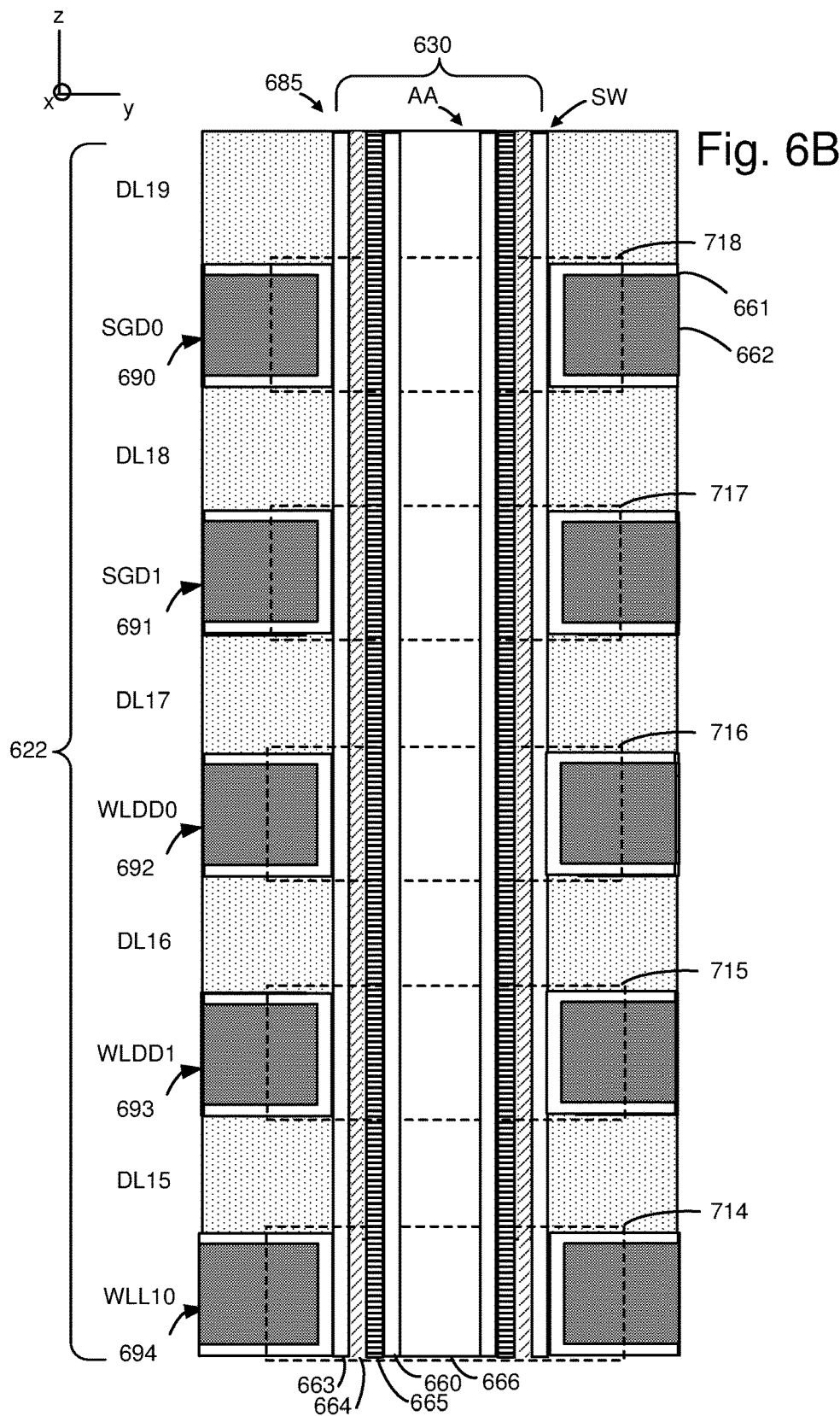

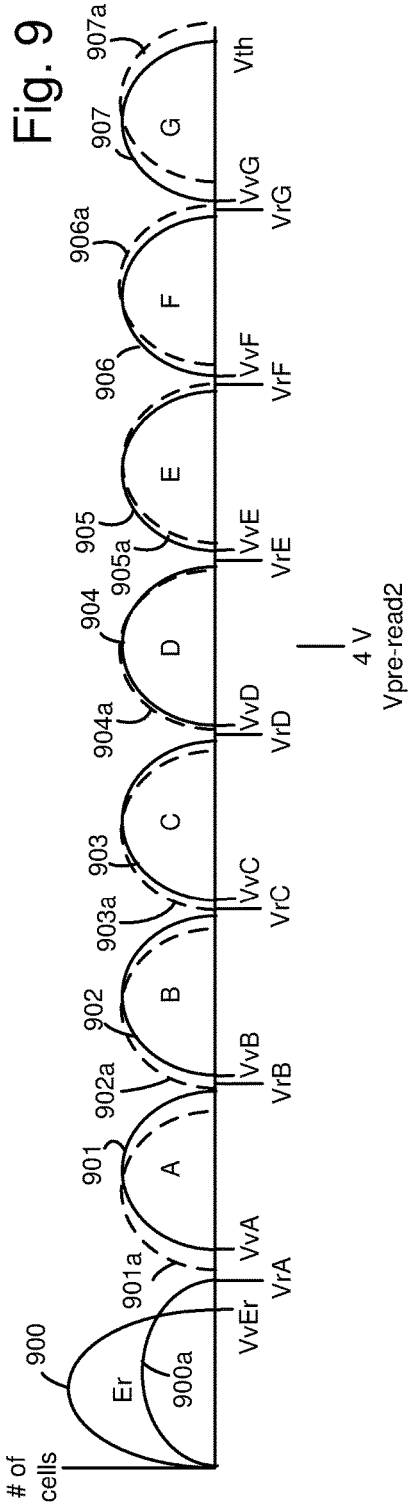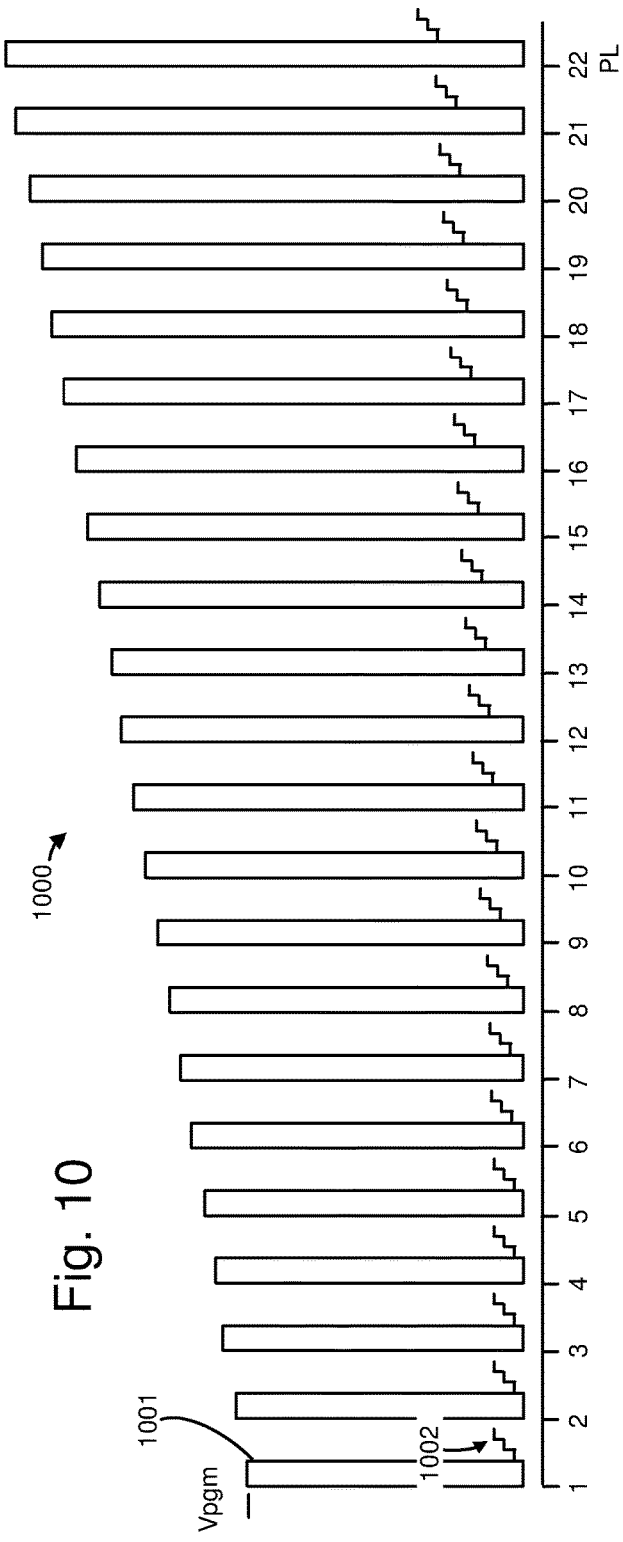

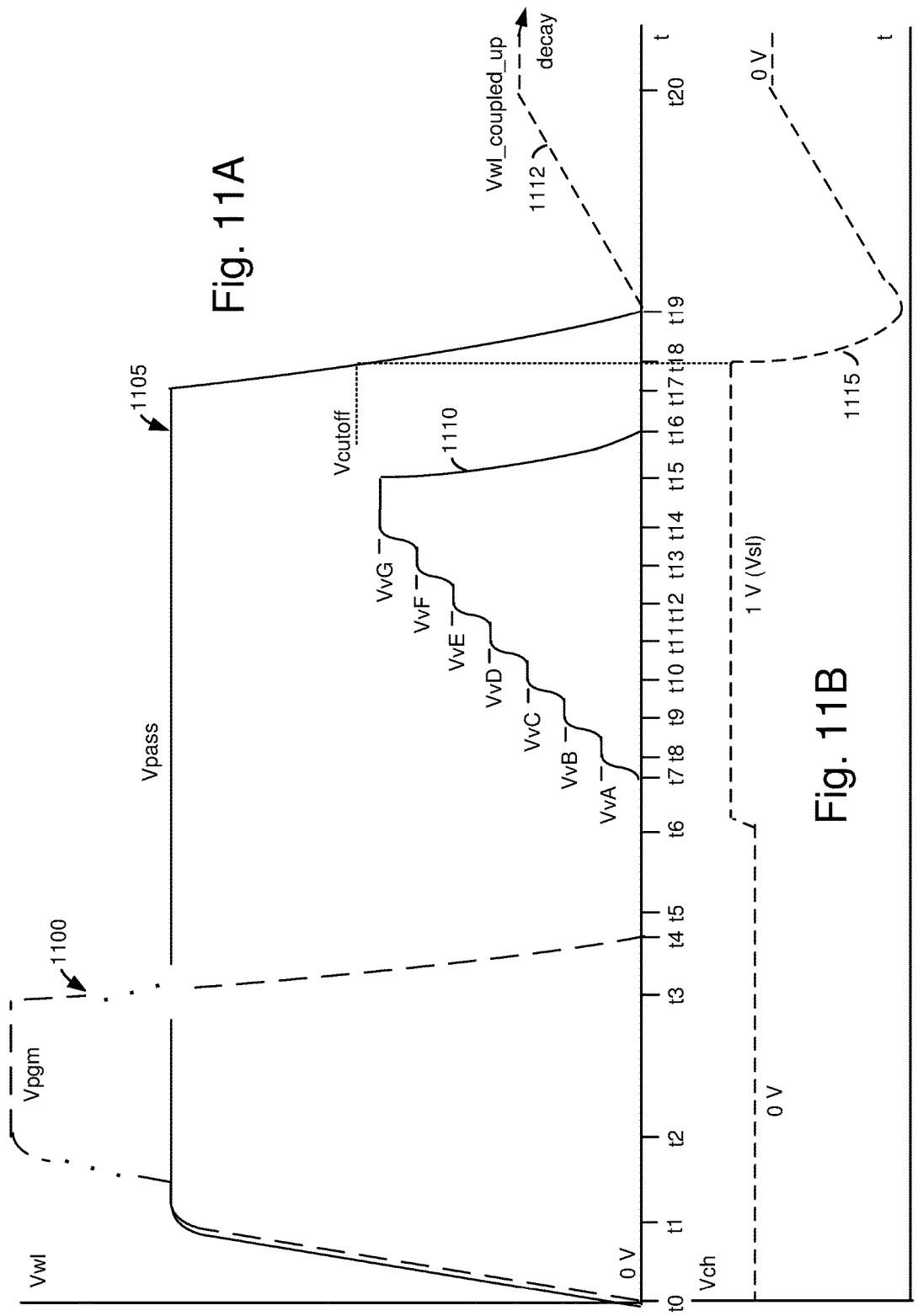

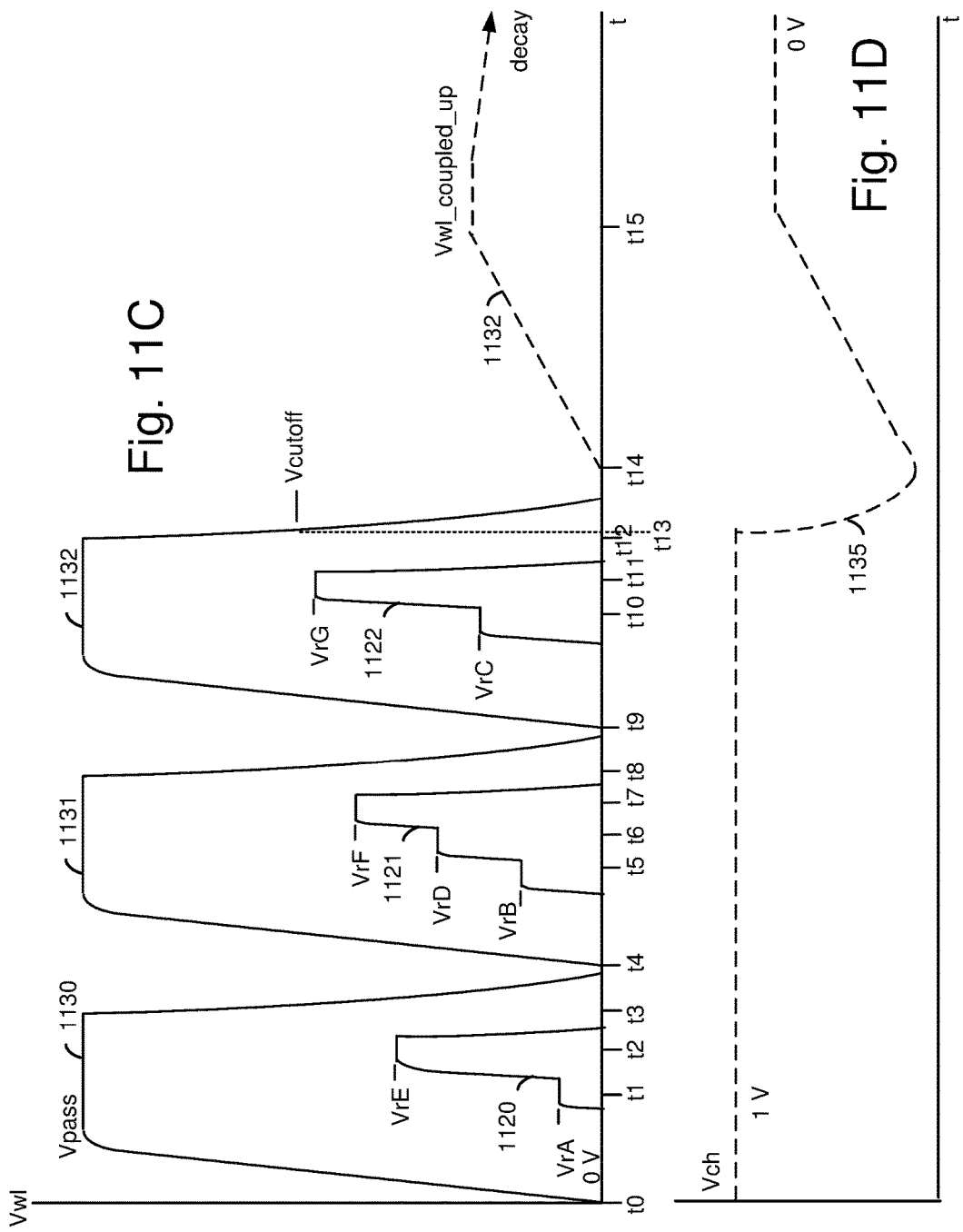

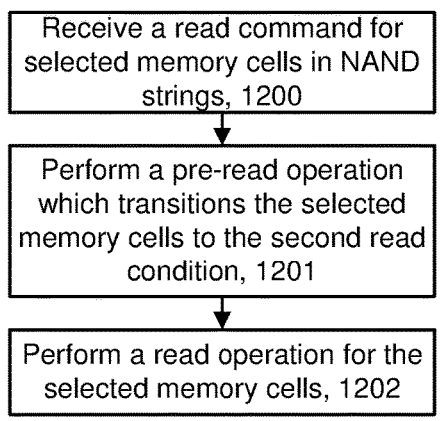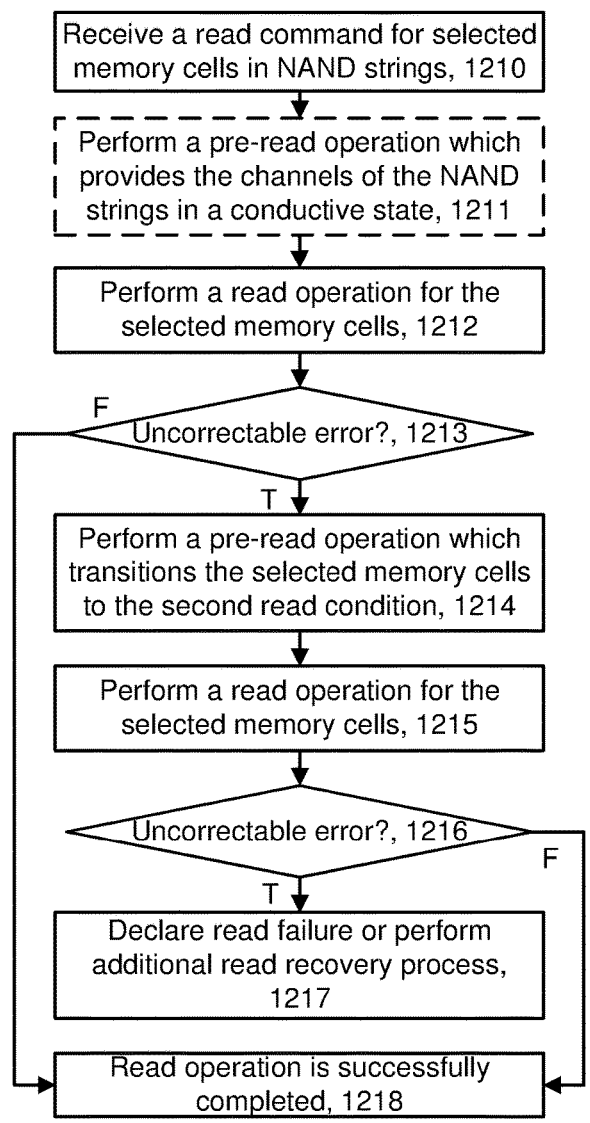

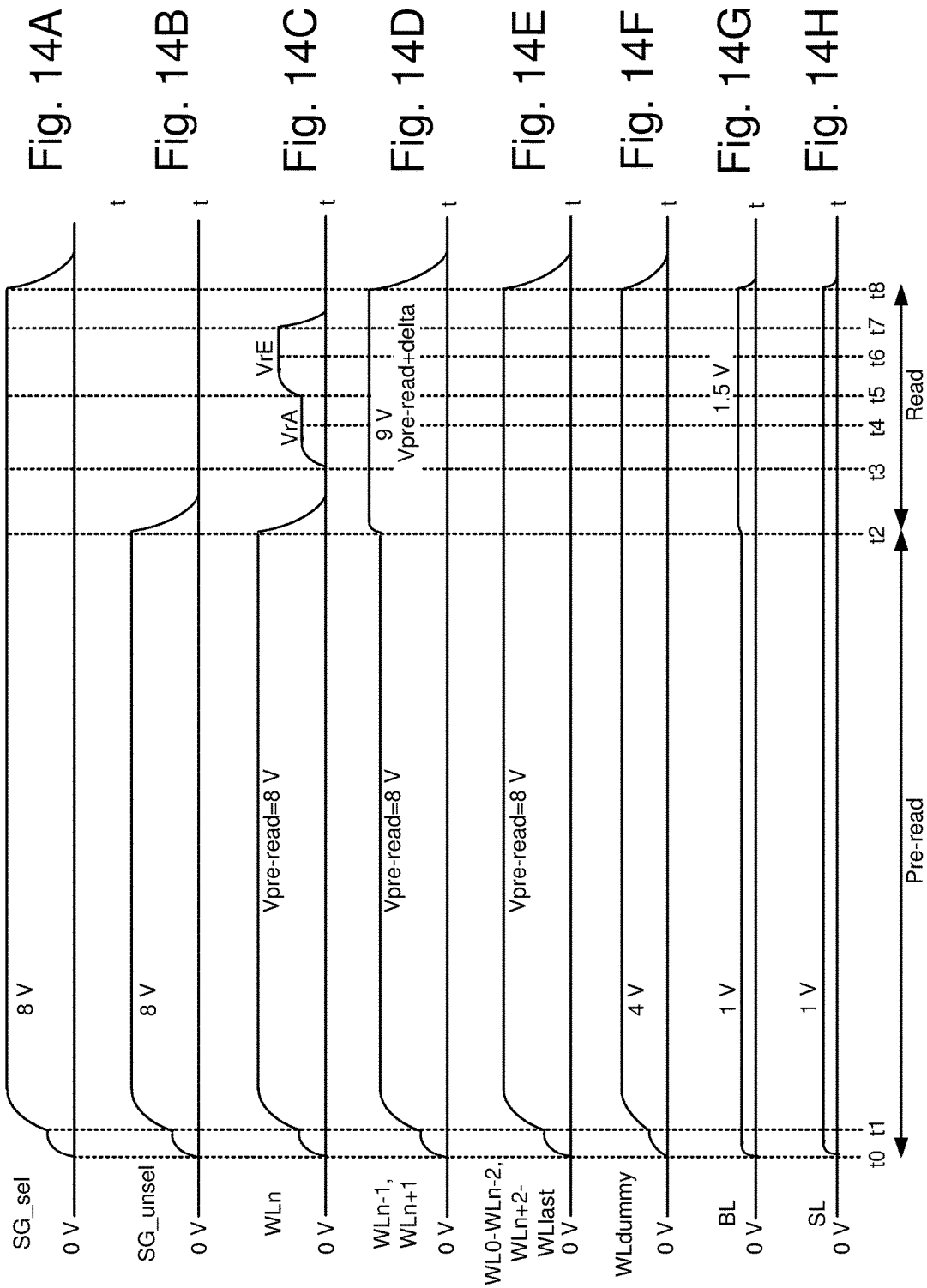

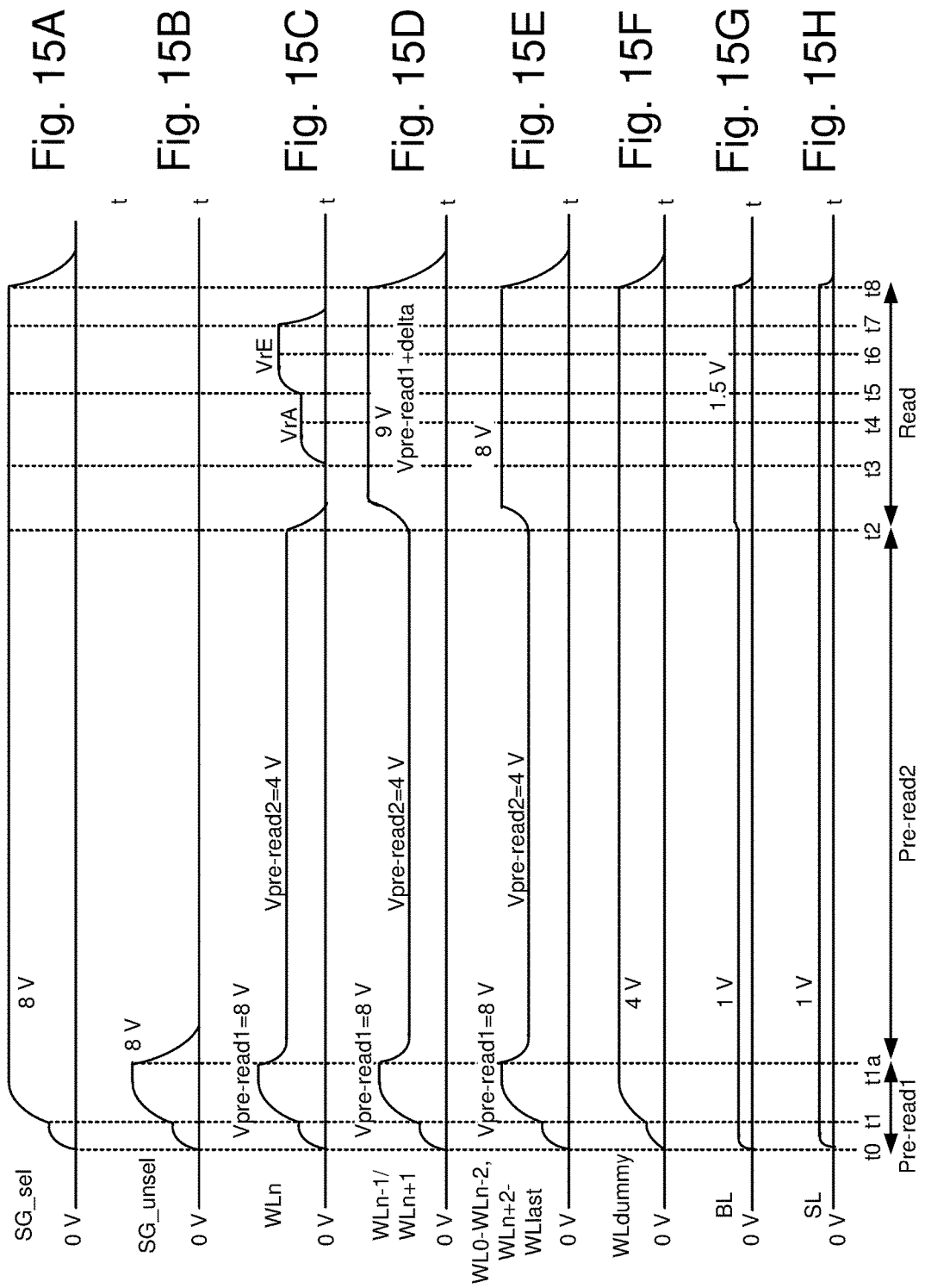

US 10,235,294 B1

PRE-READ VOLTAGE PULSE FOR FIRST READ ERROR HANDLING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 6B depicts a close-up view of the region 622 of the stack of FIG. 6A.

FIG. 9 depicts an example Vth distribution of a set of memory cells, showing a Vth shift due to a transition from a first read condition to a second read condition.

FIG. 10 depicts a voltage signal used in a series of program loops in an example program operation of a data memory cell which results in the Vth distributions 1100-1107 of FIG. 9.

FIG. 11A depicts a plot of example waveforms in a programming operation, showing coupling up of a word line voltage, consistent with FIG. 10.

FIG. 11B depicts a plot of a channel voltage (Vch) corresponding to FIG. 11A.

FIG. 11C depicts a plot of example waveforms in a read operation, showing coupling up of a word line voltage, consistent with FIG. 10.

FIG. 11D depicts a plot of a channel voltage (Vch) corresponding to FIG. 11C.

FIG. 12A depicts an example process for performing a pre-read operation in preparation for a read operation.

FIG. 12B depicts an example implementation of FIG. 12A, where a first read attempt which result in an uncorrectable error is followed by a second read attempt which includes a pre-read operation before a read operation.

FIG. 14A to 14H depict voltage in an example implementation of FIG. 12C, where FIG. 14A depicts a voltage signal for selected select gate transistors (SG_sel), FIG. 14B depicts a voltage signal for unselected select gate transistors (SG_unsel), FIG. 14C depicts a voltage signal for a selected word line (WLn), FIG. 14D depicts a voltage signal for adjacent unselected word lines (WLn−1 and WLn+1), FIG. 14E depicts a voltage signal for non-adjacent unselected word lines (WL0-WLn−2, WLn+2-WLlast), FIG. 14F depicts a voltage signal for dummy word lines (WLdummy), FIG. 14G depicts a voltage signal for bit lines (BL) and FIG. 14H depicts a voltage signal for a source line (SL).

FIG. 15A to 15H depict voltage in an example implementation of FIG. 12D, where FIG. 15A depicts a voltage signal for selected select gate transistors (SG_sel), FIG. 15B depicts a voltage signal for unselected select gate transistors (SG_unsel), FIG. 15C depicts a voltage signal for a selected word line (WLn), FIG. 15D depicts a voltage signal for adjacent unselected word lines (WLn−1 and WLn+1), FIG. 15E depicts a voltage signal for non-adjacent unselected word lines (WL0-WLn−2, WLn+2-WLlast), FIG. 15F depicts a voltage signal for dummy word lines (WLdummy), FIG. 15G depicts a voltage signal for bit lines (BL) and FIG. 15H depicts a voltage signal for a source line (SL).

DETAILED DESCRIPTION

Figure 1:
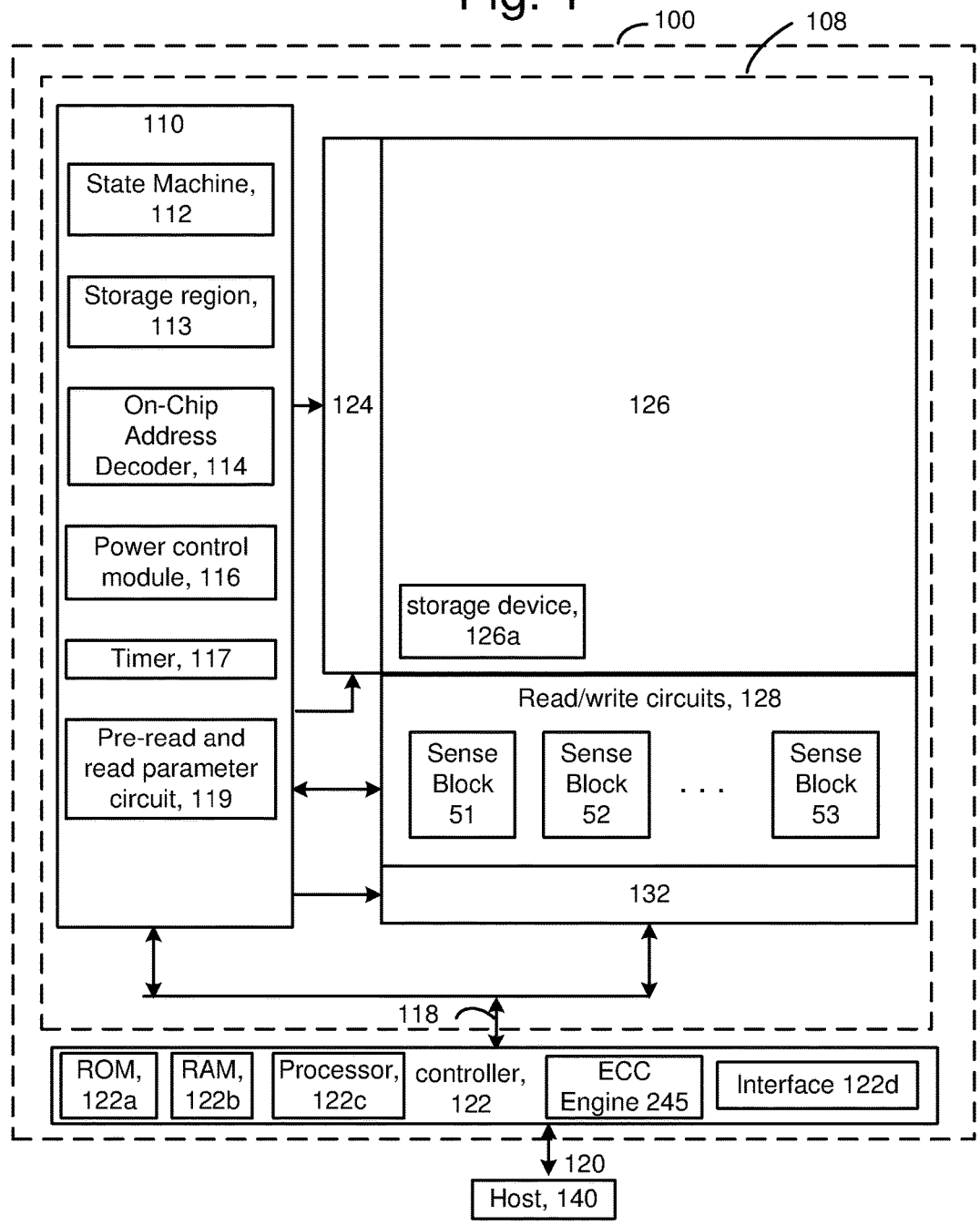
FIG. 1 is a block diagram of an example memory device.

Apparatuses and techniques are described for performing a read operation in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells.

However, it has been observed that the Vth of a memory cell can vary depending on when the read operation occurs. For example, the Vth can vary in the memory cells depending on a coupled up state of the word lines when the read operation occurs. A first read condition or state can be defined in which the word lines are not coupled up and may be discharged to a voltage close to 0 V, and a second read condition can be defined in which the word lines are fully coupled up to a level such as 4-5 V.

The memory cells can be in the first read condition after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read condition after a significant amount of time has passed after a last sensing operation, since the word lines discharge over time. When the word lines are in the coupled up state, i.e., in the second read condition, this tends to prevent a downshift in the Vth of lower state memory cells and prevent an upshift in the Vth of higher state memory cells. See also FIG. 9. On the other hand, when the word lines are in the discharged or first read condition, this tends to allow a downshift in the Vth of the lower state memory cells and allow an upshift in the Vth of higher state memory cells. The cells gradually transition from the second read condition to the first read condition over time, e.g., seconds or minutes, as the word lines are discharged.

The coupling up of the word line voltage is caused by the voltages of a sensing operation such as a verify operation which occurs in connection with a programming operation, or a read operation which occurs after a programming operation is completed. A verify operation performs a verify test to determine if a memory cell has completed programming A read operation determines the data state that is stored in a memory cell as a Vth level. The sensing of the cells involves the application of a sensing voltage (e.g., a read/verify voltage) to a selected word line. At the same time, a read pass voltage or turn on voltage is applied to the unselected word lines and then stepped down. This step down temporarily reduces a channel voltage due to capacitive coupling. See FIG. 11A to 11D. When the channel voltage increases back to its nominal level, this causes an increase or coupling up of the word line voltages, also due to capacitive coupling. For memory cells in the lower data states, the Vth gradually increases as electrons become trapped in the charge trapping material. For memory cells in the higher data states, the Vth gradually decreases as electrons are de-trapped from the charge trapping material and return to the channel. Subsequently, as the word line voltage decreases, for the memory cells in the lower data states, the Vth gradually decreases as electrons which are trapped in the charge trapping material of the cells are de-trapped and return to the channel, and for the memory cells in the higher data states, the Vth gradually increases as electrons are removed from the channel.

When a read operation occurs, it is not known if the cells are in the first or second read condition, or perhaps somewhere in between these two conditions. Accordingly, a read operation can often result in errors.

Techniques provided herein address the above and other issues. In one aspect, a pre-read operation is performed before a read operation for memory cells arranged in NAND strings. The pre-read operation transitions the memory cells from the first read condition to the second read condition so that the Vth levels will be in a desired, predictable range when the read occurs. The pre-read operation can involve maintaining voltages on a selected word line and the unselected word lines at specified levels and for a specified duration which is relatively long compared to a duration of the read operation. The word line voltages, in combination with bit line and source line voltages, provide the channels of the NAND string in a conductive state and gradually transition the memory cells to the second read condition.

In one aspect, the adjacent unselected word lines of a selected word line are treated differently than non-adjacent word lines of the selected word line. For example, the voltage on the adjacent unselected word lines can be increased during the read operation from the level used in the pre-read operation. This helps ensure the associated memory cells are in a strongly conductive state and compensates for a reduction in coupling from the selected word line as the selected word line voltage is decreased in the read operation from the level used in the pre-read operation. Moreover, the increased level of the adjacent unselected word line voltage can be avoided during the long pre-read operation to reduce the likelihood of read disturb. In contrast, the voltage on the non-adjacent unselected word lines can be maintained at the same level during the read operation and the pre-read operation.

In another aspect, the voltages used during the pre-read operation increase initially to a high level to allow the NAND string channels to become conductive, then decrease to a lower level which is comparable to the coupled up word line voltage in the second read condition. This allows the memory cells to transition to the second read condition while minimizing a likelihood of read disturb. The lower level may provide lower state memory cells among the selected memory cells in a conductive state and higher state memory cells among the selected memory cells in a non-conductive state.

In another aspect, the duration of the pre-read operation can be set as an increasing function of a time which has passed since a last read of the set of memory cells without an uncorrectable error.

In another aspect, the pre-read operation is used as part of an error handling process when a previous read operation is unsuccessful and results in an uncorrectable error.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a timer 117, and a pre-read and read parameter circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The timer 117 can keep track of a duration since a last read operation for a block. For example, this can be a last successful read operation in which there was no uncorrectable error. A timer can track this duration for each block in the memory device, for example. See also FIG. 12E. The pre-read and read parameter circuit can include, e.g., voltages for a selected word line, adjacent unselected word lines, non-adjacent unselected word lines, dummy word lines, select gate transistors, bit lines and source lines, and durations for applying these voltages, in a pre-read or read operation. The timer and pre-read and read parameter circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
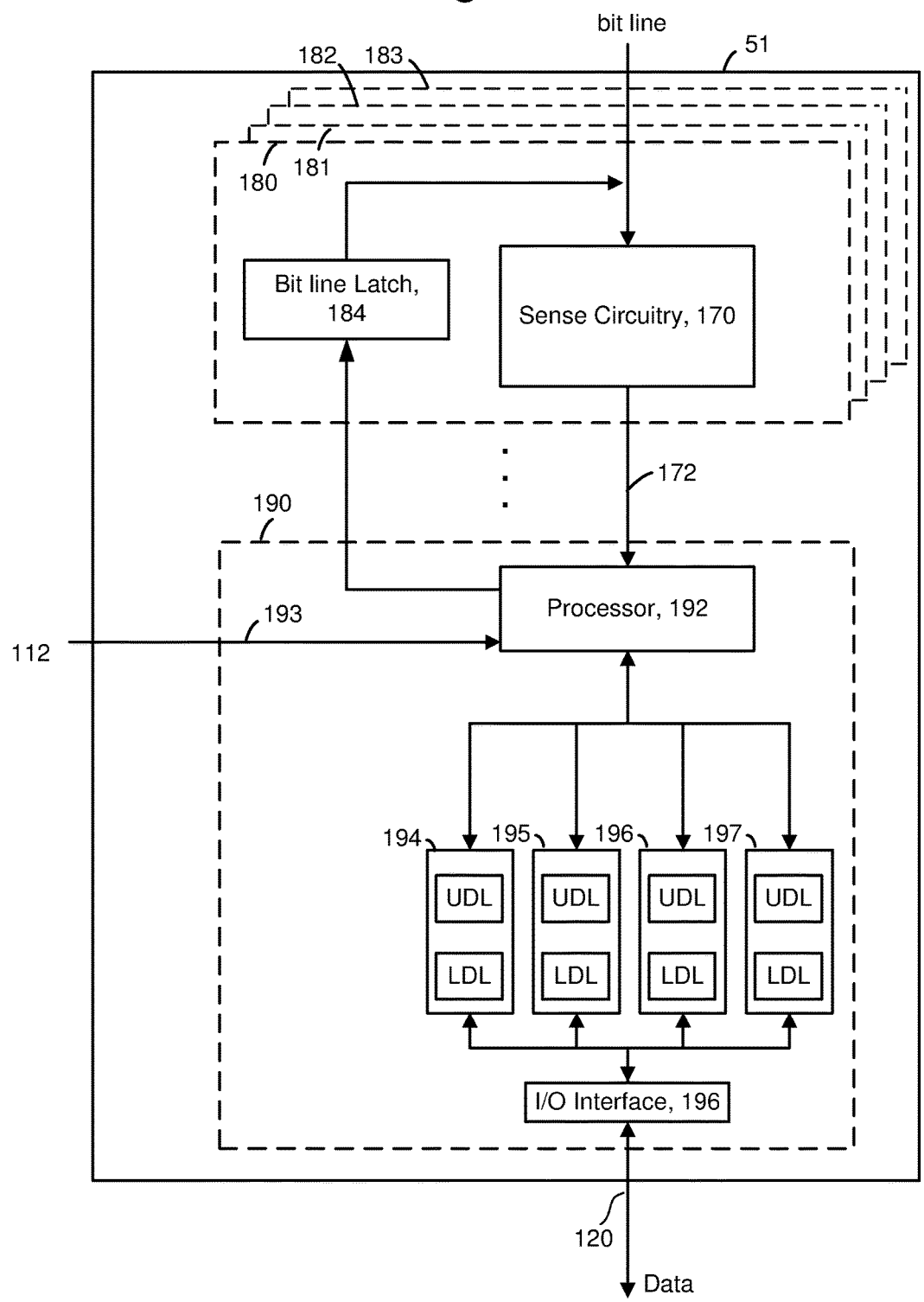
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
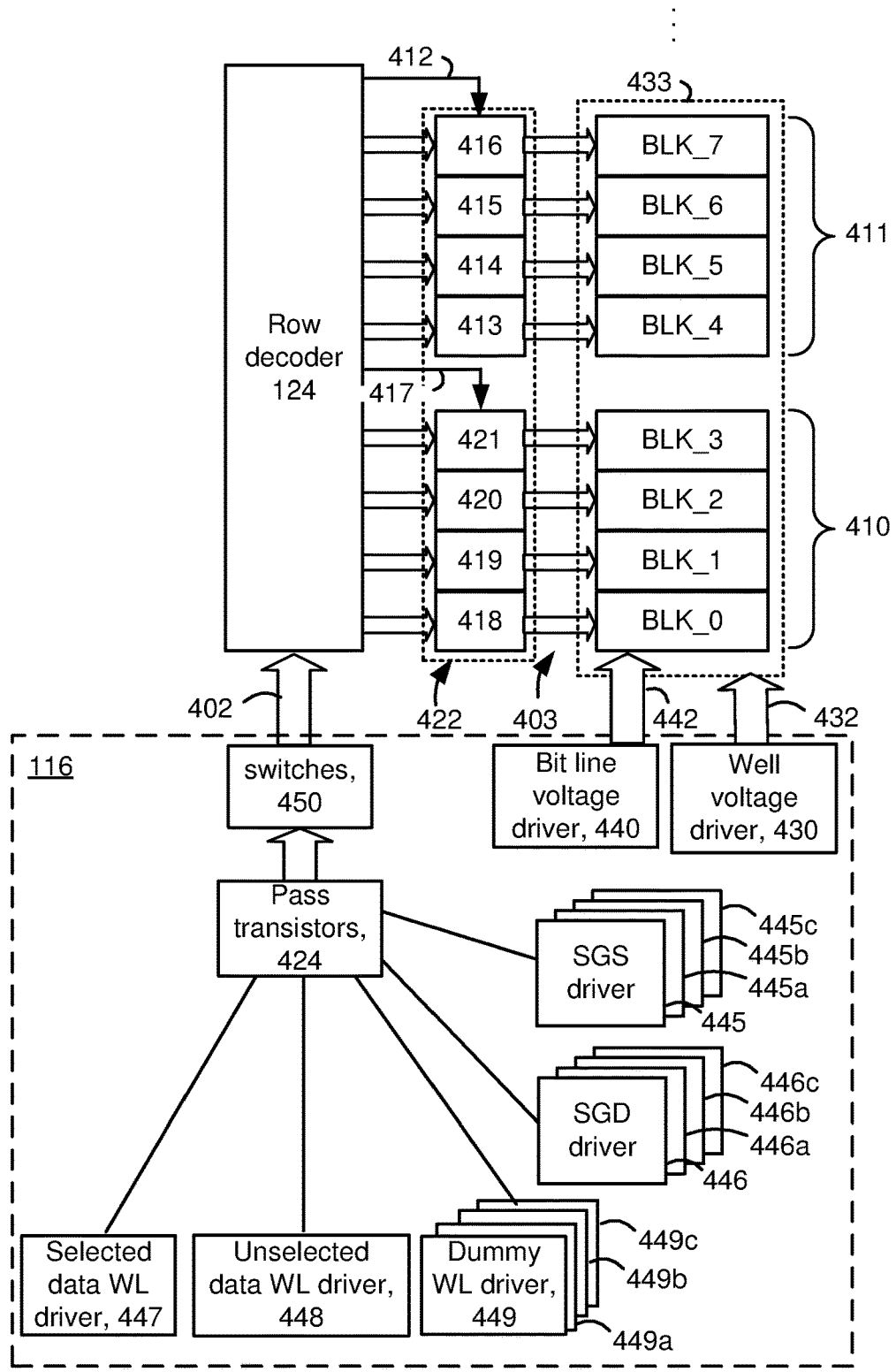
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively. See further details in FIG. 4.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 6A, during a refresh operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8A and 8B. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a (see FIGS. 6A and 8B) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
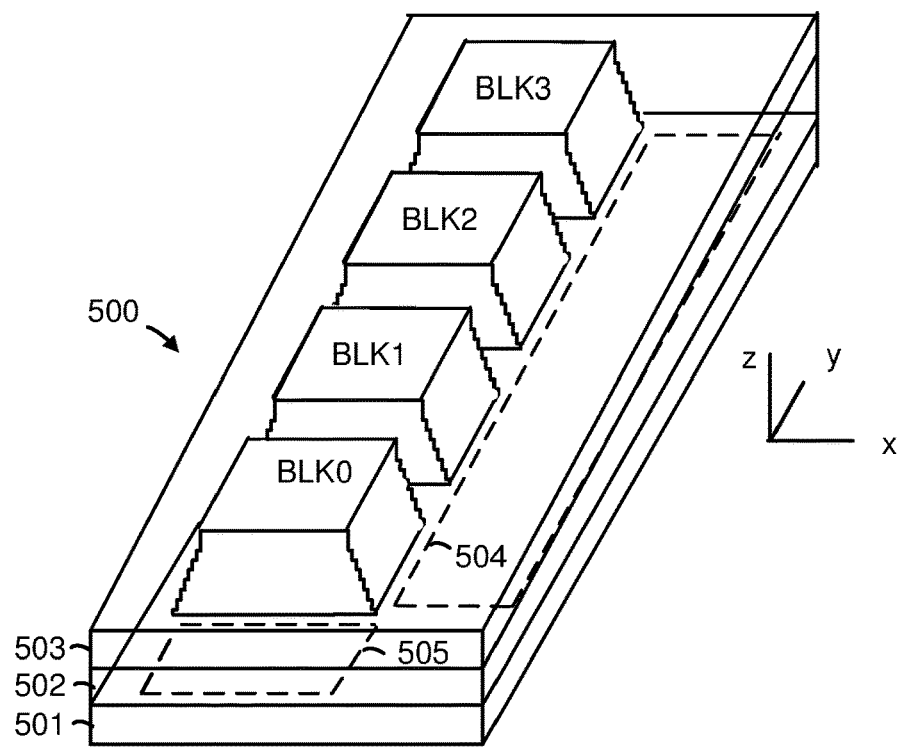
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
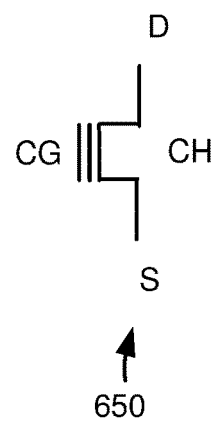
FIG. 5 depicts an example transistor 650.

FIG. 5 depicts an example transistor 650. The transistor comprises a control gate CG, a drain D, a source S and a channel CH and may represent a memory cell or a select gate transistor, for example.

Figure 6A:
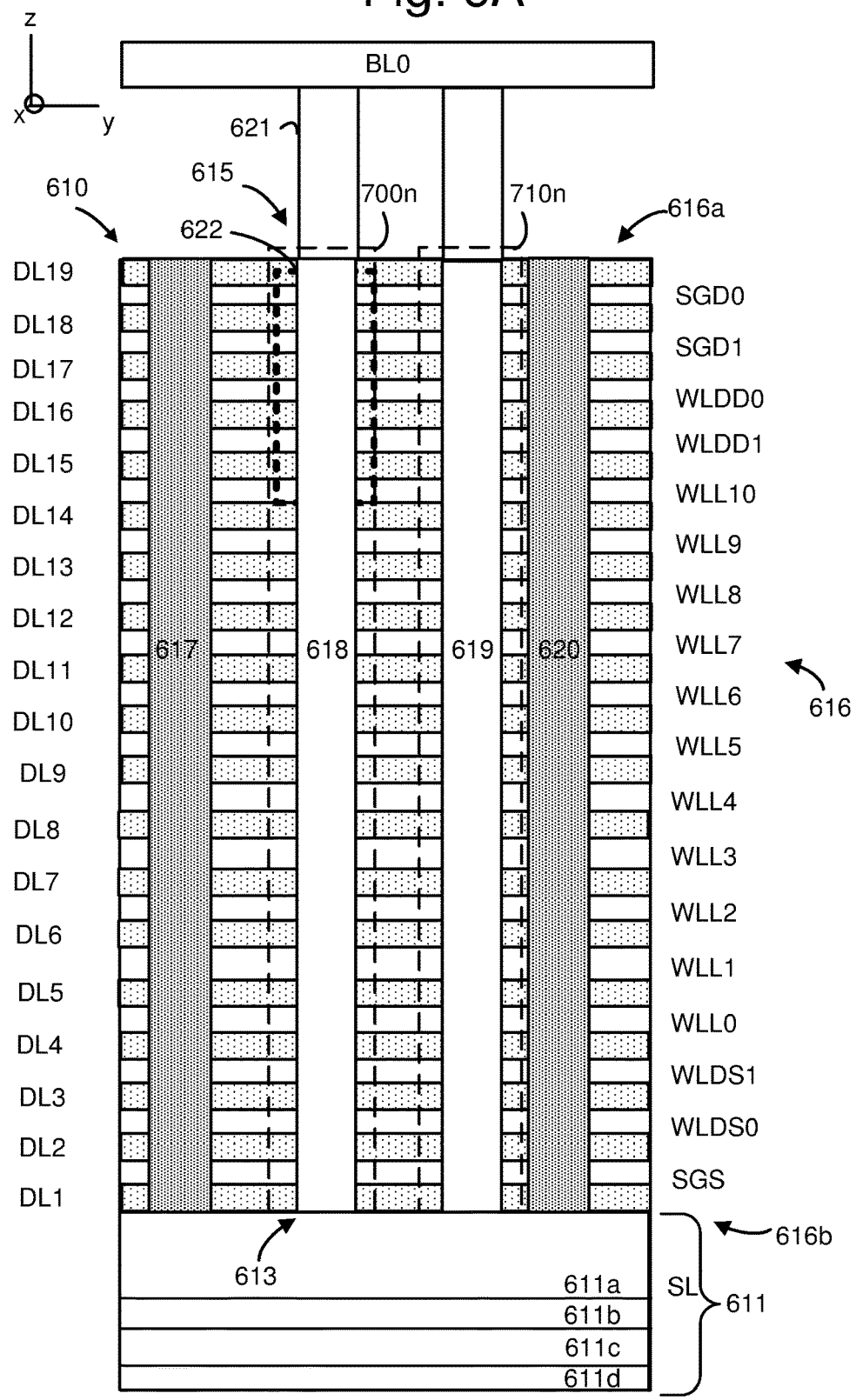
FIG. 6A depicts an example cross-sectional view of a portion of the block BLK0 of FIG. 4.

FIG. 6A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6B.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6C:
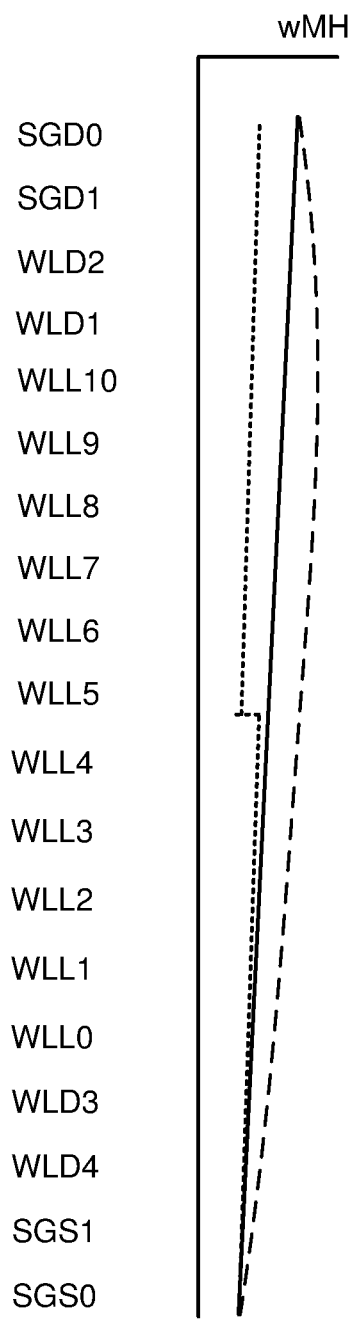
FIG. 6C depicts a plot of memory hole/pillar diameter in the stack of FIG. 6A.

FIG. 6C depicts a plot of memory hole/pillar diameter in the stack of FIG. 6A. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6C). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 13A:
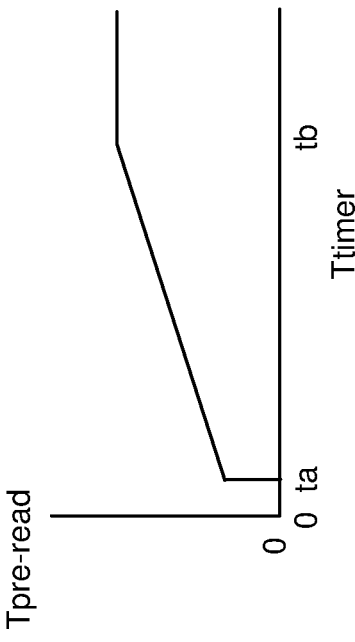
FIG. 13A depicts a plot of a number of errors in a read operation as a function of Vpre-read, consistent with FIGS. 12C and 12D.
Figure 13B:
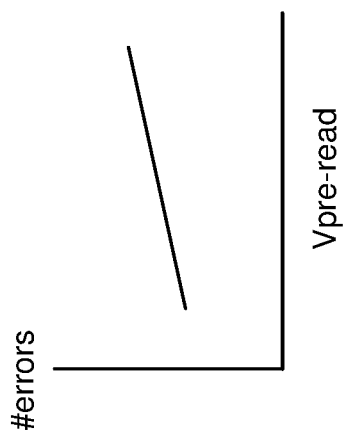
FIG. 13B depicts a plot of a Tpre-read, a duration of a pre-read operation, as a function of Ttimer, a duration since a last successful read operation of a block, consistent with step 1243 of FIG. 12E.
Figure 13C:
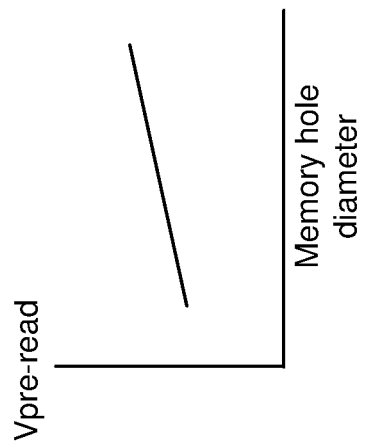
FIG. 13C depicts a plot of Vpre-read as an increasing function of memory hole, diameter, consistent with FIGS. 6C, 12C and 12D.

As mentioned in connection with FIG. 13C, the voltages which are applied to the word lines during a read operation can vary with the memory holes diameter, e.g., as an increasing function of the memory hole diameter. The voltages can include a selected word line voltage and an unselected word line voltage during a pre-read and read operation, for example.

Figure 7:
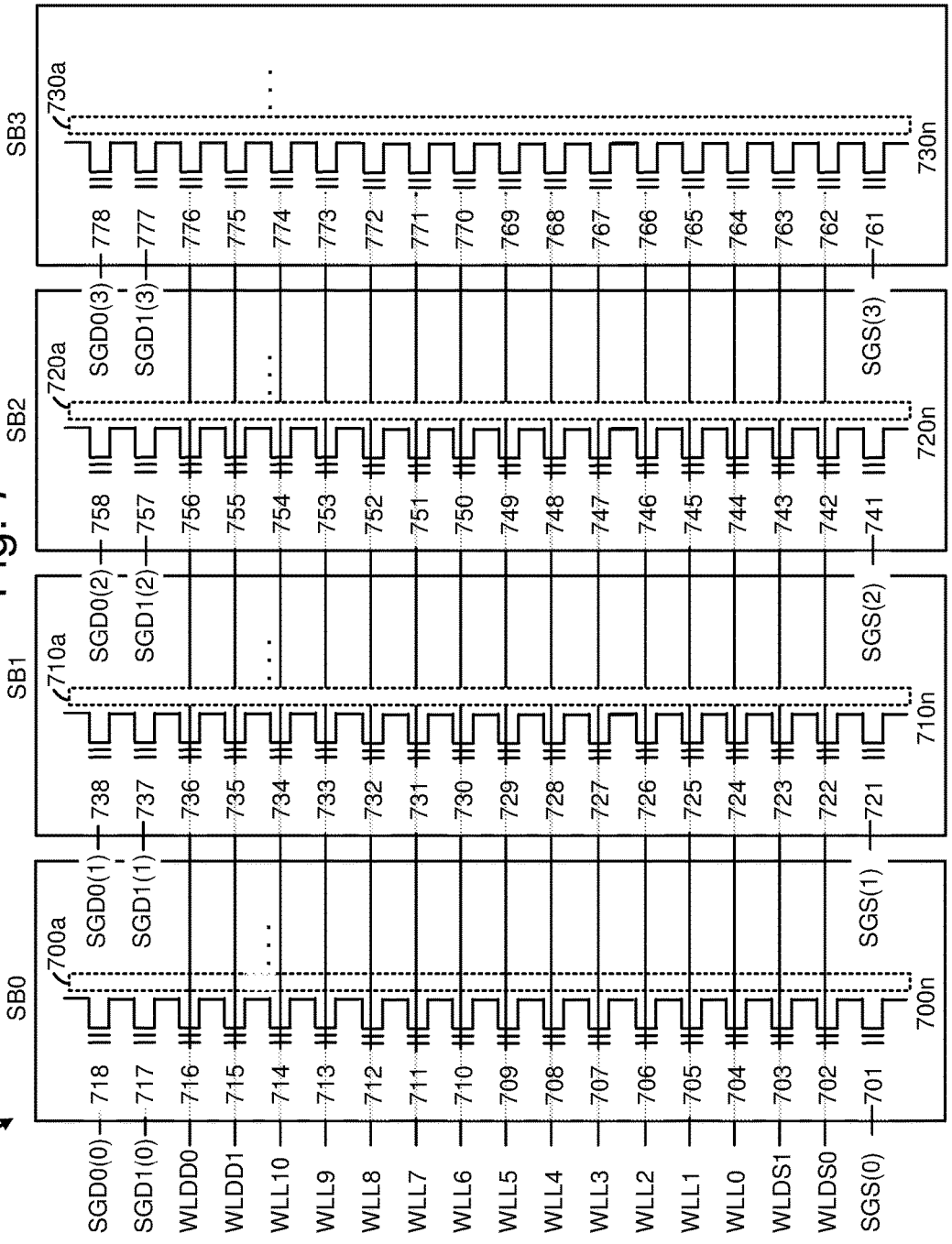
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 8A:
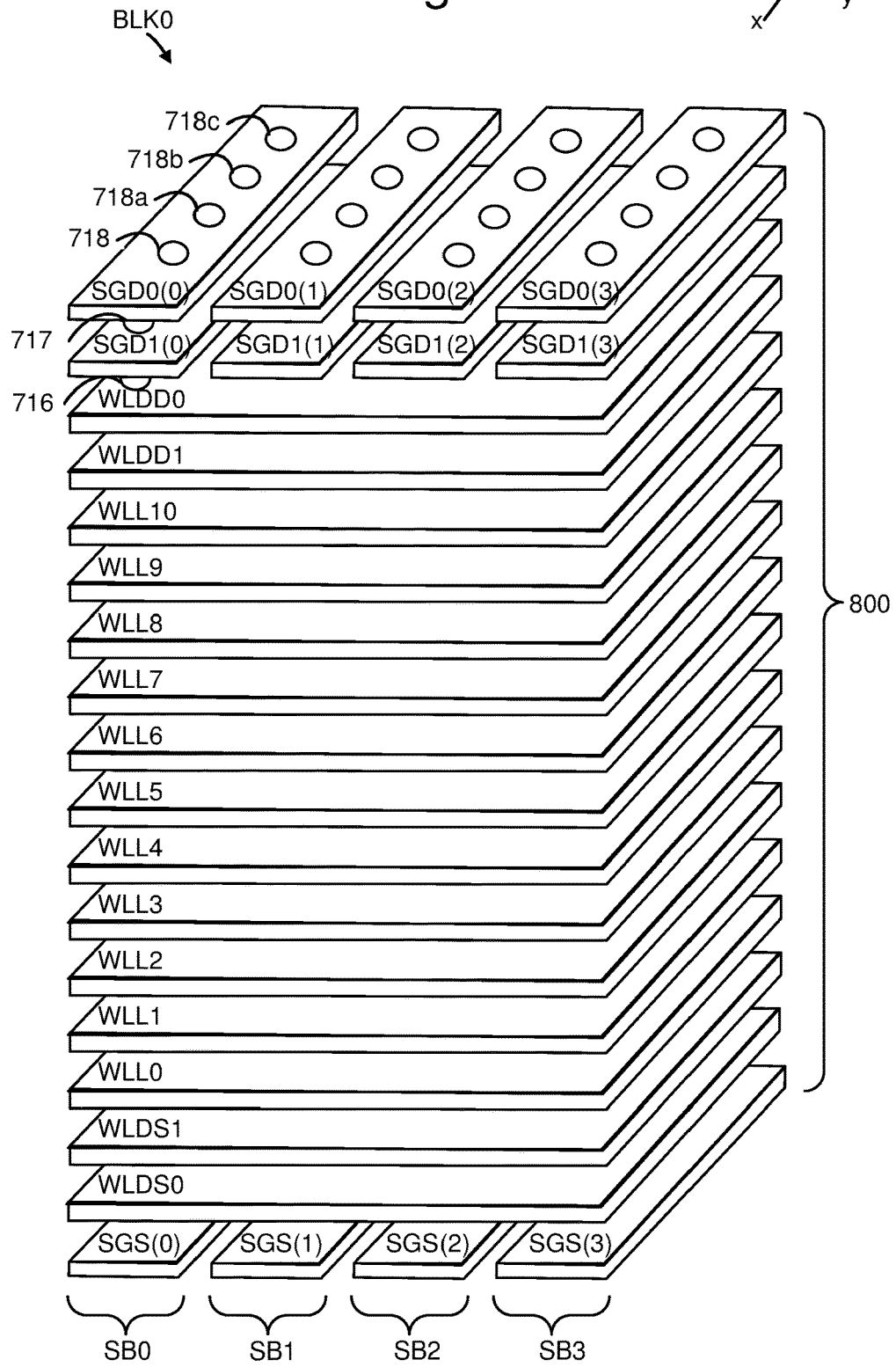
FIG. 8A depicts control gate layers in the block BLK0 consistent with FIG. 7.

FIG. 8A depicts control gate layers in the block BLK0 consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

Figure 8B:
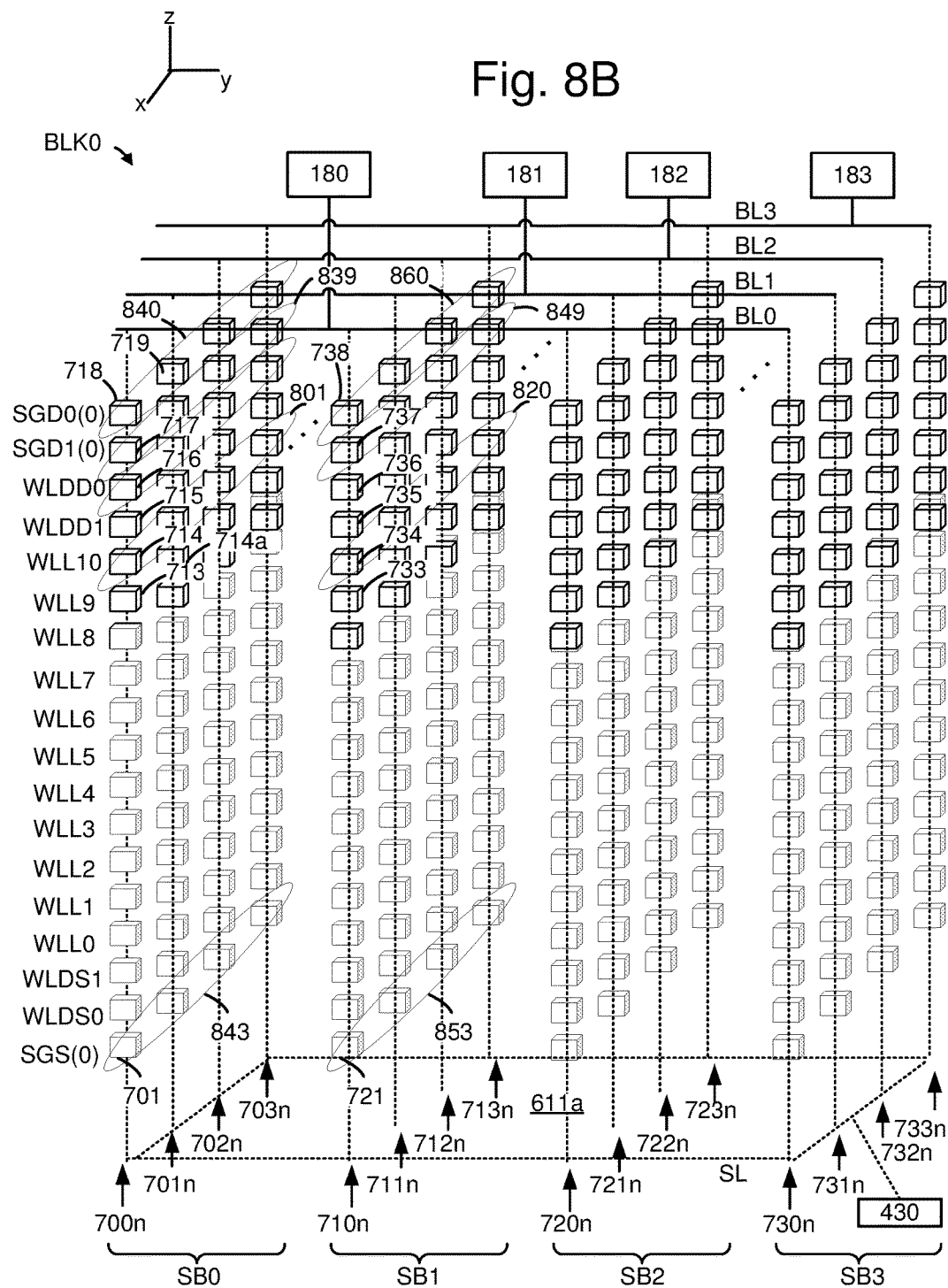
FIG. 8B depicts additional detail of the block BLK0 of FIG. 7.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells 801, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 734, is connected to WLL10 in SB1.

In this example, the source line SL or source region is driven at a voltage Vsl by the well voltage driver 430. Moreover, the source lines is common to the sub-blocks of the block. In another option, each sub-block has a respective source line so that the source lines can be se differently for a selected sub-block which is undergoing a read or program operation, for example, compared to an unselected sub-block which is not undergoing the read or program operation.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a NAND string may have their control gates connected and commonly driven. For example, SB0 has sets of SGD transistors 840 and 839, with example SGD transistors 718 and 717, respectively, in the NAND string 700*n*. The set of SGD transistors 840 also includes an example SGD transistor 719 in the NAND string 701*n*. SB0 also has a set of SGS transistors 843, with an example SGS transistor 701 in the NAND string 700*n*. Similarly, SB1 has sets of SGD transistors 860 and 849, with example SGD transistors 738 and 737, respectively, in the NAND string 710*n*. SB1 also has a set of SGS transistors 853, with an example SGS transistor 721 in the NAND string 710*n*.

The NAND string 700*n* includes SGD transistors 718 and 717 connected to select gate lines SGD0(0) and SGD1(0), respectively, dummy memory cells 716 and 715 connected to WLDD0 and WLDD1, respectively, and data memory cells 714 and 713 connected to WLL10 and WLL9, respectively. The NAND string 710*n* includes SGD transistors 738 and 737 connected to select gate lines SGD0(1) and SGD1(1) (see FIG. 7), respectively, dummy memory cells 736 and 735 connected to WLDD0 and WLDD1, respectively, and data memory cells 734 and 733 connected to WLL10 and WLL9, respectively.

FIG. 9 depicts an example Vth distribution of a set of memory cells, showing a Vth shift due to a transition from a first read condition to a second read condition. The vertical axis depicts a number of memory cells, on a logarithmic scale, and the horizontal axis depicts a Vth of the memory cells on a linear scale. In one approach, at a start of a program operation, the memory cells are all initially in the erased state as represented by the Vth distribution 900. After the program operation is successfully completed, the memory cells assigned to the Er state are represented by the Vth distribution 900*a*. The Vth distribution is upshifted due to program disturb.

The memory cells which are programmed to the A, B, C, D, E, F and G states using verify voltages of VvA, VvB, VvC, VvD, VvE, VvF and VvG, respectively, are represented by the Vth distributions 901, 902, 903, 904, 905, 906 and 907, respectively. The Vth distributions are obtained just after completion of the program operation, when the memory cells are in the second read condition. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage. In one approach, the control gate read voltages are set assuming that the second read condition is present.

However, due to a decay of the channel voltage, the Vth levels of the data memory cells can shift. In particular, the Vth level can shift lower for the lower states (e.g., the A-C states) and higher for the higher states (e.g., the E-G states) as represented by Vth distributions 901*a*, 902*a* and 903*a* for the A, B and C state memory cells, respectively, and by Vth distributions 905*a*, 906*a* and 907*a* for the E, F and G state memory cells, respectively. The D state memory cells may not have a noticeable downshift of upshift during the transition from the second read condition to the first read condition, in one embodiment.

A voltage referred to as Vpre-read2, such as 4 V, is an example of a voltage which is comparable to the channel voltage in the second read condition. Vpre-read2 is also mid-way between the lowest and highest programmed data states so that when Vpre-read2 is applied to a selected word line, the memory cells in the lower data states will be in a conductive state and the memory cells in the higher data states will be in a non-conductive state. Vpre-read2 may be applied in a pre-read operation as shown in FIG. 15C-15E.

Generally, the decrease in the Vth levels is greatest for the lowest programmed data state, e.g., the A state and the increase in the Vth levels is greatest for the higher programmed data state, e.g., the G state. If the Vth downshift or upshift is too great, read errors can result. By performing a pre-read operation as described herein, the Vth downshift or upshift can be partially or fully reversed so that the original Vth distributions 901-907 are obtained before reading occurs.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

FIG. 10 depicts a voltage signal used in a series of program loops in an example program operation of a data memory cell which results in the Vth distributions 900-907 of FIG. 9. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1000 includes a series of program voltages, including an initial program voltage 1001, which are applied to a word line selected for programming In this example, the voltage signal includes program voltages which increase stepwise in amplitude in one or more program loops of a programming pass using a fixed or varying step size. This is referred to as incremental step pulse programming, where the program voltage (Vpgm) starts at an initial level (see program voltage pulse 1001) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, a Vth distribution similar to that in FIG. 9 is achieved, and the data can be read from the memory cells using read voltages which are between the Vth distributions. At the same time, a read pass voltage, Vpass (e.g., 8-10 V), also referred to as pass voltage or turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. See FIGS. 14C and 15C. The data of the middle page can be determined by reading the memory cells using read voltages of VrB, VrD and VrF. The data of the upper page can be determined by reading the memory cells using read voltages of VrC and VrG.

FIG. 11A depicts a plot of example waveforms in a programming operation, showing coupling up of a word line voltage, consistent with FIG. 10. As mentioned at the outset and, e.g., in connection with FIG. 9, the control gate or word line voltage of the memory cells can be coupled up while floating to a level such as 4 V after a program or read operation. This provides the memory cells in a second read condition. FIGS. 11A and 11B describe the floating which occurs after a program operation and FIGS. 11C and 11D describe the floating which occurs after a read operation.

The time period shown represents one program-verify iteration or loop. The horizontal axis depicts time and the vertical axis depicts word line voltage, Vwl. A program voltage 1100 is applied to a selected word line from t0-t4 and reaches a magnitude of Vpgm. The program voltage can temporarily pause at an intermediate level such as Vpass to avoid a single large transition which can have undesired coupling effects. A pass voltage 1105 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1110 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG, or from a voltage slightly higher than VvG, to 0 V or other steady state level from t15-t16.

For the unselected word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG (or lower due to post-programming charge loss) and as high as the Vth at the upper tail of the G state in the Vth distribution 907 in FIG. 9. Vcutoff can therefore be as low as VvG+Vsl or as high as Vth of G state upper tail+Vsl. As the pass voltage 1105 decreases from Vcutoff to 0 V, the channel is capacitively coupled down by a similar amount, as represented by plot 1115 in FIG. 11B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1112 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 11B depicts a plot of a channel voltage (Vch) corresponding to FIG. 11A. For an unselected NAND string (a NAND string not having a cell which is programmed in the current program loop), Vch will be boosted to a level such as 8 V (not shown) during the program voltage, e.g., from t0-t4. Specifically, Vch is coupled higher due to capacitive coupling from the word lines, when the voltages of the word lines are ramped up from 0 V to Vpass or Vpgm. The coupling is facilitated by allowing Vch to float. Vch can float when the ends of the NAND string are cutoff, so that the channel is disconnected from the source line and bit line. The ends of the NAND string, in turn, are cutoff when the control gate voltages of the SGD and SGS transistors of the unselected NAND string are set to a low level (less than the Vth of the SGD and SGS transistors) which results in the SGD and SGS transistors being in a non-conductive state. For a selected NAND string (a NAND string having a cell which is programmed in the current program loop), Vch is typically grounded as shown during the program voltage. Vch can be grounded by grounding the bit line, and setting a control gate voltage of the SGD transistor to a high level (above the Vth of the SGD transistor) such that the SGD transistor is in a conductive state, which allows the channel to communicate with the bit line.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1112) are capacitively coupled higher by the increase in Vch. The voltages of the word lines float to a peak level of Vwl_coupled_up, e.g., about 5 V, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=−4.4 V, for instance. Accordingly, there is a 4.4 V increase in Vch which is coupled to the word line, e.g., control gate, of the memory cells. Vwl_coupled_up may be about 4.4×0.9=4 V. The voltages of the word lines are floated by disconnected the word lines from a word line driver.

FIG. 11C depicts a plot of example waveforms in a read operation, showing coupling up of a word line voltage, consistent with FIG. 10. A read operation is similar to a verify operation as both are sensing operations and both can provide a coupling up of the word line voltages. The horizontal axis depicts time and the vertical axis depicts word line voltage, Vwl. Pass voltages 1130, 1131 and 1132 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1120 (at levels of VrA and VrE), 1121 (at levels of VrB, VrD and VrF) and 1122 (at levels of VrC and VrG) for each of the lower, middle and upper pages, respectively, consistent with FIG. 12. The read voltages are optimized for the second read condition, as an example, and are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1132 decreases from Vcutoff to 0 V, the channel is capacitively coupled down by a similar amount, as represented by the plot 1135 in FIG. 11D. As the channel voltage increases after t14, the word line voltages are floated and are coupled higher, to Vwl_coupled_up.

Coupling up can also occur after an erase operation. At the end of the erase-verify operation, both Vsgd and Vsgs ramp down and cut off the channel when their control gate voltage falls below their Vth, e.g., 2 V (or higher in some cases). When the select gate voltage continues to decrease to 0 V, the channel potential, especially under the SGD transistor and the DD0 dummy memory cell, is down coupled due to gate-to-channel coupling. This is an unstable situation since Vbl=0 V, so that electron-hole pairs are generated in the channel. The channel potential returns to about 0 V, causing coupling up of the control gate of the dummy memory cell to about 2 V. The down coupling and associated coupling up is greater when the Vth of the select gate transistor is higher.

FIG. 11D depicts a plot of a channel voltage (Vch) corresponding to FIG. 11C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1132) are capacitively coupled higher by the increase in Vch (plot 1135). The voltages of the word lines float to a peak level of Vwl_coupled_up, as discussed.

FIG. 12A depicts an example process for performing a pre-read operation in preparation for a read operation. Step 1200 includes receiving a read command for selected memory cells in NAND strings. The selected memory cells may be connected to a selected word line in a block, for instance. The read command may be received by the controller 122 or control circuitry 110, for instance, from the host 140. Step 1201 includes performing a pre-read operation which transitions the selected memory cells to the second read condition, e.g., from the first read condition or from a condition which is between the first and second read conditions. Step 1202 includes performing a read operation for the selected memory cells. In one embodiment, the pre-read operation is performed in preparation for the read operation, and the read operation begins upon completion of the re-read operation.

Note that the pre-read operation also transitions the unselected memory cells to the second read condition. If an additional read operation is performed on memory cells of another word line of the same block as the currently selected word line, within a specified amount of time in which the memory cells are not expected to transitions back to the first read condition, the pre-read operation can potentially be omitted or replaced by a shorter pre-read operation when reading the another word line.

FIG. 12B depicts an example implementation of FIG. 12A, where a first read attempt which result in an uncorrectable error is followed by a second read attempt which includes a pre-read operation before a read operation. In one approach, an initial read operation occurs in response to a read command, where this initial read operation does not include a pre-read operation which is designed to transition the memory cells to the second read condition. The initial read operation may optionally include a pre-read operation for the purpose of providing the channels of the NAND strings in a conductive state, to facilitate the sensing which occurs in the subsequent read operation. This this pre-read operation may involve applying turn on voltages to the word lines such as 8 V. However, this pre-read operation is generally much shorter in duration than a pre-read operation which is designed to transition the memory cells to the second read condition. For example, the duration of the pre-read operation of step 1211 can be less than 5-10% of the duration of the pre-read operation of step 1214. The pre-read operation of step 1214 can be considered to be part of an error handling routine which is triggered when an uncorrectable error occurs.

Step 1210 includes receiving a read command for selected memory cells in NAND strings. Step 1211 includes performing a pre-read operation which provides the channels of the NAND strings in a conductive state. Step 1212 includes performing a read operation for the selected memory cells, such as by applying one or more control gate read voltages (e.g., VrA-VrG in FIG. 9) to the selected word line while sensing whether the memory cells are in a conductive state. The read results may be output from the chip to the controller 122 and processed using an ECC decoding process at the controller. If the process determines that there is no uncorrectable error at decision step 1213, the read operation is successfully completed at step 1218. If there is an uncorrectable error, step 1214 involves performing a pre-read operation which transitions the selected memory cells to the second read condition. Step 1215 includes performing another read operation for the selected memory cells. This may be similar to step 1212.

The read results may be processed using an ECC decoding process, as mentioned. If the process determines that there is no uncorrectable error at decision step 1216, the read operation is successfully completed at step 1218. If the process determines that there is still an uncorrectable error at decision step 1216, step 1217 declares a read failure or performs an additional read recovery process. In one approach, the additional read recovery process can involve reading the memory cells while shifting the control gate read voltage slightly higher and lower than the nominal levels depicted in FIG. 9 to try to locate a read voltage which does result in an uncorrectable error, or to obtain soft bits of read data which assist in decoding the hard bits of read data, where the hard bits of read data are obtained using the nominal read voltages.

Figure 12C:
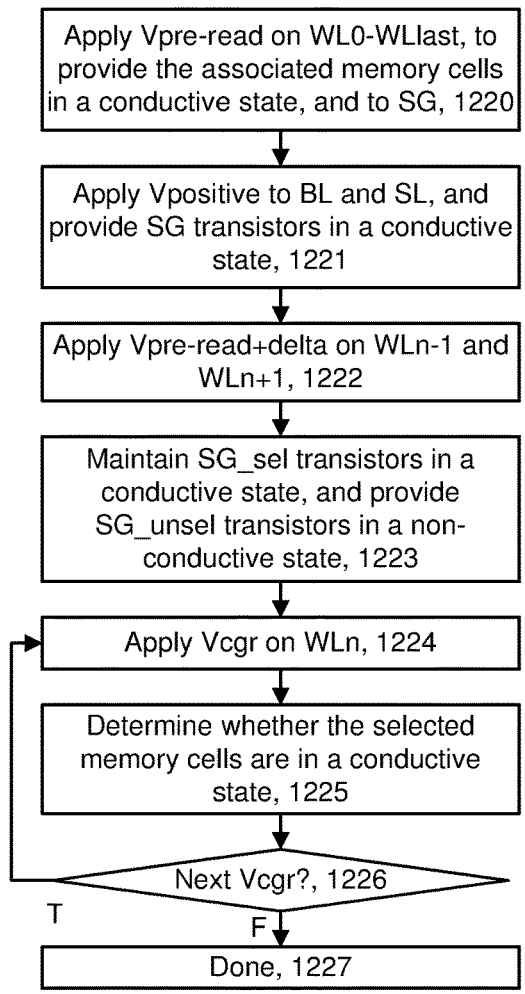
FIG. 12C depicts an example implementation of FIG. 12A, where an adjacent word line of a selected word line receives a voltage Vpre-read during a pre-read operation and a higher voltage Vpre-read+delta during a read operation.

FIG. 12C depicts an example implementation of FIG. 12A, where an adjacent word line of a selected word line receives a voltage Vpre-read during a pre-read operation and a higher voltage Vpre-read+delta during a read operation. This approach helps ensure the memory cells of the unselected word lines are in a strongly conductive state during the read operation by compensating for a reduction in coupling from the selected word line to the adjacent word liens as the selected word line voltage is decreased in the read operation from the level used in the pre-read operation. This approach also helps reduce the likelihood of read disturb by providing a lower word line voltage during the pre-read operation than during the read operation. Refer also to FIG. 14A to 14H. The process includes the pre-read operation at steps 1220 and 1221 and the read operation at steps 1222-1227.

Step 1220 includes applying a voltage Vpre-read, e.g., 8 V, to WL0-WLlast (all of the data word lines), to provide the associated memory cells (connected to the word lines) in a conductive state, as depicted by FIG. 14C-14E at t0-t2. Vpre-read is also applied to the select gate (SG) transistors, e.g., the SGS and SGD transistors, to provide them in a conductive state, as depicted by FIGS. 14A and 14B at t0-t2. The SG transistors include selected transistors, SG_sel, which are in the NANDs string being read, and unselected transistors, SG_unsel, which are in the NANDs string not being read. For example, a read operation may involve a selected sub-block among multiple sub-blocks in a block. Further, within a sub-block, a read operation may involve all, or a portion of the NAND strings. Typically, a read operation involves a page of data, where one word line stores one or more pages in one sub-block.

See also FIG. 7 and WLL0 (or WL0, the source side data word line of the block) to WLL10 (or WLlast, the drain side data word line of the block). WL0-WLlast includes WLn in FIG. 14C, WLn−1 and WLn+1 in FIG. 14D, and WL0-WLn−2 and WLn+2-WLlast in FIG. 14E. Step 1221 includes applying a positive voltage Vpositive, e.g., 1 V, to the bit lines (BL) and source line (SL) in the block as depicted by FIGS. 14G and 14H, respectively.

In the read operation, step 1222 includes applying Vpre-read+delta, e.g., 9 V, where delta is 1 V, to WLn−1 and WLn+2 as depicted in FIG. 14D at t2-t8. The voltages may be transitioned directly from Vpre-read to Vpre-read+delta to save time, compared to transitioning the voltages from Vpre-read to 0 V and then from 0 V to Vpre-read+delta. Step 1223 includes maintaining the SG_sel transistors in a conductive state at t2-t8, and providing the SG_unsel transistors in a non-conductive state. For the selected sub-block, the SG transistors (SG_sel) are made conductive to allow a sensing current to flow in the associated NAND string channels. For, an unselected sub-block, the SG transistors (SG_unsel) are made non-conductive to avoid interfering with the sensing in the selected sub-block.

Step 1224 involves applying a control gate read voltage (Vcgr) on WLn, the selected word line. Step 1225 includes determining whether the selected memory cells are in a conductive state, e.g., by sensing the selected memory cells using the associated sense circuits. A decision step 1226 determines if there is a next Vcgr. For example, in FIG. 14c, VrA and VrE are applied in turn when reading a lower page of data. If decision step 1226 is true, the next Vcgr is applied at step 1224. If the decision step 1226 is false, the read operation is done at step 1227.

Figure 12D:
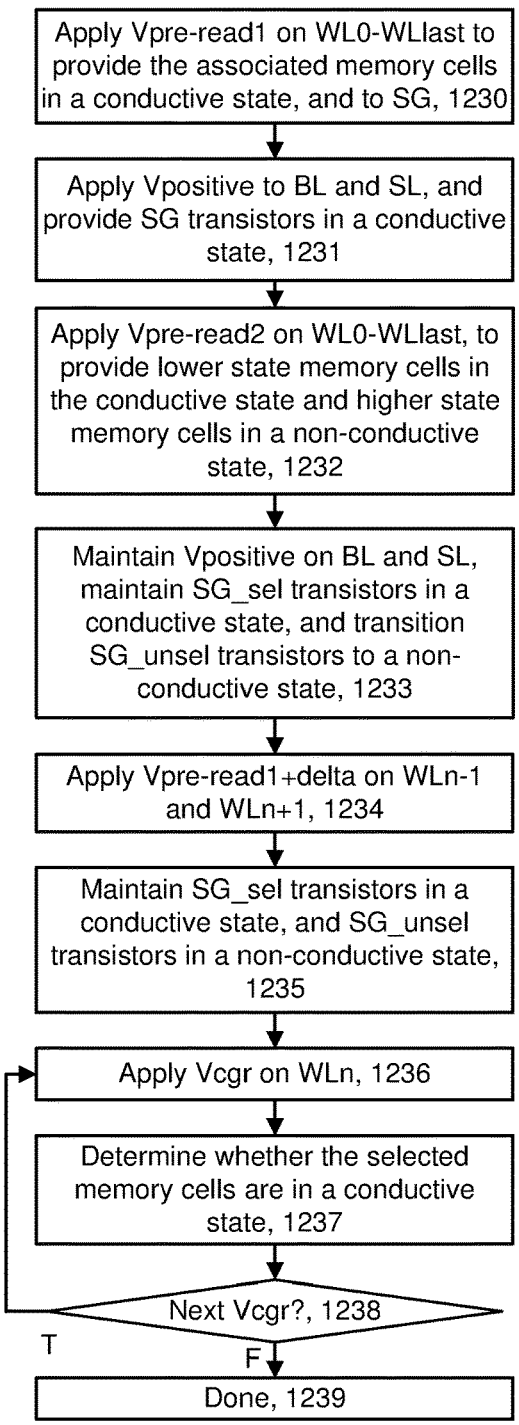
FIG. 12D depicts an example implementation of FIG. 12A, where an adjacent word line of a selected word line receives a voltage Vpre-read1 during a first part of a pre-read operation, a lower voltage Vpre-read2 (lower than Vpre-read1) during a second part of the pre-read operation, and a higher voltage Vpre-read1+delta (higher than Vpre-read1) during a read operation.

FIG. 12D depicts an example implementation of FIG. 12A, where an adjacent word line of a selected word line receives a voltage Vpre-read1 during a first part of a pre-read operation, a lower voltage Vpre-read2 (lower than Vpre-read1) during a second part of the pre-read operation, and a higher voltage Vpre-read1+delta (higher than Vpre-read1) during a read operation. See also FIG. 15A to 15H. This approach provides an initially high voltage on the word lines which provides the channel in a conductive state. This facilitates the movement of electrons in the channel when a subsequent lower voltage is applied. The word line voltage is high for a limited time so that any read disturb is minimized, while the subsequent lower voltage is similar to the coupled up word line voltage of the second read condition, e.g., 4 V, to help transition the memory cells to the second read condition.

The process includes the pre-read operation at steps 1230-1233 and the read operation at steps 1234-1239. Furthermore, the pre-read operation has a first portion at steps 1230 and 1231 and a second portion at step 1232 and 1233. In the first portion of the pre-read operation, step 1230 includes applying a voltage Vpre-read1, e.g., 8 V, on WL0-WLlast (all the data word lines), to provide the associated memory cells in a conductive state, as depicted by FIG. 15C-15E at t0-t1a. Vpre-read1 is also applied to the SG transistors to provide them in a conductive state, as depicted by FIGS. 15A and 15B. Step 1231 includes applying Vpositive, e.g., 1 V, to the bit lines (BL) and source line (SL) in the block as depicted by FIGS. 15G and 15H, respectively.

In the second portion of the pre-read operation, step 1232 includes applying a voltage Vpre-read2, e.g., 4 V, and less than Vpre-read1, on WL0-WLlast, to provide the lower state memory cells in a conductive state and the higher state memory cells in a non-conductive state, as depicted by FIG. 15C-15E at t1a-t2. Step 1233 includes maintaining Vpositive on the bit lines and source line (FIGS. 15G and 15H, respectively), maintaining the SG_sel transistors in a conductive state (FIG. 15A), and transitioning the SG_unsel transistors to a non-conductive state (FIG. 15B at ta1).

Step 1234 includes applying a voltage Vpre-read+delta, which is stepped up from Vpre-read1 by an amount of delta, e.g., 1 V, on WLn−1 and WLn+1. These are the adjacent word lines of WLn. See FIG. 15D at t2-t8. Step 1235 includes maintaining the SG_sel transistors in a conductive state and the SG_unsel transistors in a non-conductive state. Step 1236 involves applying Vcgr on WLn. Step 1237 includes determining whether the selected memory cells are in a conductive state. A decision step 1238 determines if there is a next Vcgr. If decision step 1238 is true, the next Vcgr is applied at step 1236. If the decision step 1238 is false, the read operation is done at step 1239.

Figure 12E:
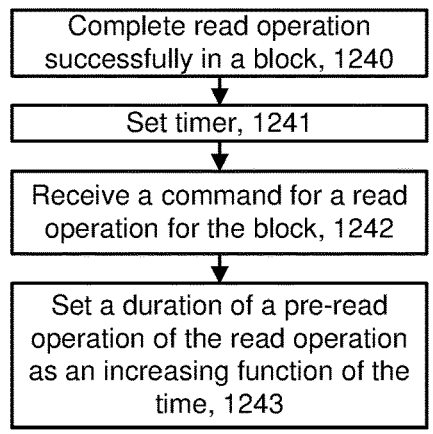
FIG. 12E depicts a process for use with FIG. 12C or 2D in setting Vpre-read as a function of a timer which indicates a duration since a last successful read operation of a block.

FIG. 12E depicts a process for use with FIG. 12C or 2D in setting Vpre-read as a function of a timer which indicates a duration since a last successful read operation of a block. Refer also to FIG. 13B. Step 1240 determines that a read operation has been successfully completed in a block. Step 1241 sets a timer. Step 1242 includes receiving a command for a read operation for the block, e.g., for a selected word line in the block. Step 1243 includes setting a duration of a pre-read operation of the read operation as an increasing function of the time. That is, as the time is counted higher by the timer and a longer duration has passed since the time was set, the duration of the pre-read operation can be made higher. This helps tailor the pre-read operation to the current condition of the memory cells and the coupled up level of the word lines.

FIG. 13A depicts a plot of a number of errors in a read operation as a function of Vpre-read, consistent with FIGS. 12C and 12D. As Vpre-read increases, the amount of read disturb on the memory cells of WLn−1 and WLn+1 can increase and this results in more read errors. Based on this principle, in the example of FIG. 14D, the voltage on WLn−1 and WLn+1 is at a lower level during the pre-read operation than during the read operation. This is relevant as the pre-read operation is typically much longer than the read operation. The read disturb is apparent after multiple read cycles have been performed. The read disturb is due to read stress, which in turn is a function of the gate-to-channel voltage of a memory cell and the duration in which the voltage is maintained.

FIG. 13B depicts a plot of a Tpre-read, a duration of a pre-read operation, as a function of Ttimer, a duration since a last successful read operation of a block, consistent with step 1243 of FIG. 12E. As mentioned, the duration of the pre-read operation can increase as the timer increases because a higher duration (Ttimer) since a last successful read operation indicates the memory cells are more likely to be in, or close to, the first read condition. As a result, a longer pre-read operation is indicated to transition the memory cells back to the second read condition. In one approach, if Ttimer is between 0-ta, Tpre-read is zero, so that no pre-read operation is performed. Or, a short pre-read operation such as discussed in connection with FIG. 12B, step 1211 may be performed. As Ttimer increases to tb, Tpre-read may reach a maximum duration. The optimal values of to and tb can be determined from testing.

FIG. 13C depicts a plot of Vpre-read as an increasing function of memory hole, diameter, consistent with FIGS. 6C, 12C and 12D. As mentioned in connection with FIG. 6C, when the memory hole diameter is relatively small, the effect of a given word line voltage is relatively stronger, so that the word line voltage should be reduced. Accordingly, to further reduce the likelihood of read disturb while transitioning the memory cells to the second read condition, the word line voltage can be tailored to the associated memory hole diameter. In one embodiment, the NAND strings extend vertically and are formed in memory holes in a stack, the memory holes have a diameter which increases with a height in the stack, and in the pre-read operation, the voltage applied to the adjacent unselected word line is an increasing function of the height.

FIG. 14A to 14H depict voltage in an example implementation of FIG. 12C, where FIG. 14A depicts a voltage signal for selected select gate transistors (SG_sel), FIG. 14B depicts a voltage signal for unselected select gate transistors (SG_unsel), FIG. 14C depicts a voltage signal for a selected word line (WLn), FIG. 14D depicts a voltage signal for adjacent unselected word lines (WLn−1 and WLn+1), FIG. 14E depicts a voltage signal for non-adjacent unselected word lines (WL0-WLn−2, WLn+2-WLlast), FIG. 14F depicts a voltage signal for dummy word lines (WLdummy), FIG. 14G depicts a voltage signal for bit lines (BL) and FIG. 14H depicts a voltage signal for a source line (SL). In these figures, the vertical direction indicates voltage and the horizontal direction indicates a common time axis. The time period encompasses a sequence of a pre-read operation followed by a read operation.

Assuming SB0 is a selected sub-block in FIG. 7, SG_sel may refer to SGD(0), SGD1(0) and SGS(0) in SB0. SG_unsel may refer to SGD(1), SGD1(1) and SGS(0) in SB1, SGD(2), SGD1(2) and SGS(2) in SB2 and SGD(3), SGD1(3) and SGS(3) in SB3. WLn may refer to WLL5 as an example. In this case, WLn−1 and WLn+1 (the adjacent unselected word lines) are WLL4 and WLL6, respectively. The non-adjacent unselected word lines, WL0-WLn−2 are WLL0-WLL3, and WLn+2-WLlast are WLL7-WLL10. WLdummy includes WLDD0, WLDD1, WLDS1 and WLDS2.

Also, assume the NAND string 700n is an example selected NAND string, so that the memory cell 709 is a selected memory cell. The memory cells 708 and 710 are example adjacent memory cells and the memory cells 704-707 and 711-714 are example non-adjacent unselected memory cells.

The NAND string includes a set of memory cells 704-714 (e.g., data memory cells) which comprises non-adjacent unselected memory cells connected to the non-adjacent unselected word lines, non-adjacent to the selected word line. Additionally, in the pre-read operation, a control circuit is configured to apply a voltage (Vpre-read=8 V) to the non-adjacent unselected word lines which provides the non-adjacent unselected memory cells in the conductive state. In the read operation, the control circuit is configured to apply a voltage (Vpre-read+delta=9 V) to the non-adjacent unselected word lines which provides the non-adjacent unselected memory cells in the conductive state. The voltage (Vpre-read) applied to the non-adjacent unselected word line in the pre-read operation is less than the voltage (Vpre-read+delta) applied to the adjacent unselected word lines in the read operation.

The pre-read operation begins at t0, where the select gate lines and word lines are increase to a turn on level. This increase may occur in two steps to reduce power consumption. The turn on level is a voltage which is sufficiently high to place the associated transistors in a conductive state. For example, this can be 8 V (Vpre-read) for the select gate lines and data word lines and 4 V for the dummy word lines. Additionally, a positive voltage such as 1 V is applied to the opposing ends of the NAND strings via the bit line and source line. This helps provide the channel in a conductive state to facilitate electron movement when the turn on voltages are applied to the word lines. As mentioned, with the word line voltages applied, for memory cells in the lower data states, the Vth gradually increases as electrons become trapped in the charge trapping material, and for memory cells in the higher data states, the Vth gradually decreases as electrons are de-trapped from the charge trapping material and return to the channel.

The pre-read operation extends from t0-t2 which can be 100 microseconds, for example. This is relatively long compared to the duration of the read operation from t2-t8 which may be 50 microseconds, for example. The duration of the pre-read operation may be at least 50-100% longer than the duration of the read operation. The duration of the pre-read operation may be at least twice as long as a duration of the read operation. At the end of the pre-read operation, the voltages for SG_sel and WLn return to a lower level such as 0 V. The voltage on WLn is increased to the first control gate read voltage of VrA at t3 and sensing occurs at t4. The voltage on WLn is then increased to the second control gate read voltage of VrE at t5 and sensing occurs at t6. The voltage on WLn decreases to 0 V at t8. This is an example of a lower page read.

At the start of the read operation, the voltage on WLn−1 and WLn+1 increases directly from Vpre-read to Vpre-read+ delta, e.g., from 8 V to 9 V, to ensure that the memory cells connected to these word lines remain in a strongly conductive state, to allow accurate sensing of the memory cells of WLn to occur. By using the lower voltage of Vpre-read for the lengthy pre-read operation, read disturb on the memory cells of WLn−1 and WLn+1 is reduced. In this example, the same Vpre-read is used on all of the data word lines. However, other options are possible. For example, a lower Vpre-read such as 7 V could be used on WLn−1 and WLn+1 than on the other data word lines. This voltage can then be stepped up to a level such as 8 V during the read operation, where this level is the same as the level used during the pre-read operation on the other data word lines.

The voltage on SG_sel, WL0-WLn−2, WLn+2-WLlast and WLdummy may be maintained at the same level (8 V or 4 V) during the pre-read and read operations, in one approach. In another option, the voltage on WL0-WLn−2 and WLn+2-WLlast is increased in the read operation compared to the pre-read operation and this increase is less than the increase in the voltage on WLn−1 and WLn+1.

During the sensing of the memory cells in the read operation, the BL voltage may increase slightly to, e.g., 1.5 V to provide an appropriate level for sensing. The sense circuit may detect a decay in the bit line voltage when Vcgr is applied to determine whether a corresponding selected memory cell is in a conductive state. If the decay is below a trip level at a sense time, this indicates the memory cell and NAND string are conductive, and that the Vth of the memory cell is below Vcgr.

During the pre-read operation, turning on the SG_unsel transistors helps prevent a read disturb in the unselected NAND strings (the NAND strings not being read). If the SG_unsel transistors were kept in a non-conductive state, the channels of the associated NAND strings would float, so that the channel potential will be coupled up as the word line voltages increase. In the read operation, when a relatively low Vcgr is applied to the selected word line, but the Vth of the selected memory cell is relatively high, such as when doing an A state read on a G state memory cell, this can create a large potential gradient between the selected word line and the adjacent unselected word lines. This gradient can generate electron hole pairs in the channel, where the electrons are drawn into the charge trapping material of the memory cells of the adjacent unselected word lines.

In contrast, when the SG_unsel transistors are turned on, as described herein, the channels of the unselected NAND strings can be maintained at the same level as the BL and SL voltage and are not coupled up as the word line voltages increase, thereby eliminating this read disturb issue. The SG_sel transistors may be turned on during all, or part, of the pre read operation, as shown in FIGS. 14A and 15A, respectively.

The voltages applied to the word lines during the pre-read operation can be considered to be pre-read voltage pulses.

FIG. 15A to 15H depict voltage in an example implementation of FIG. 12D, where FIG. 15A depicts a voltage signal for selected select gate transistors (SG_sel), FIG. 15B depicts a voltage signal for unselected select gate transistors (SG_unsel), FIG. 15C depicts a voltage signal for a selected word line (WLn), FIG. 15D depicts a voltage signal for adjacent unselected word lines (WLn−1 and WLn+1), FIG. 15E depicts a voltage signal for non-adjacent unselected word lines (WL0-WLn−2, WLn+2-WLlast), FIG. 15F depicts a voltage signal for dummy word lines (WLdummy), FIG. 15G depicts a voltage signal for bit lines (BL) and FIG. 15H depicts a voltage signal for a source line (SL). This approach differs from the approach of FIG. 14A-14H in that a high turn on voltage (e.g., 8 V) is applied for a brief period (t0-t1a) at the start of the pre-read operation to provide the channel in a conductive state. By applying the high voltage for a brief period, such as 5 microseconds out of 100 microseconds or 5% of the duration of the pre-read operation, the likelihood of read disturb is reduced.

A lower voltage, Vpre-read2, such as 4 V is applied in a remainder of the pre-read operation, from t1a-t2. Vpre-read2 is similar to the coupled up word line voltage of the second read condition and therefore provides an optimal transition of the memory cells to the second read condition. In particular, Vpre-read2 is higher than the Vth of the lower state memory cells and therefore acts to increase their Vth, and is lower than the Vth of the higher state memory cells and therefore acts to decrease their Vth. These Vth shifts are opposite to what occurs when the memory cells transition to the first read condition. Vpre-read2 is also low enough to further reduce the likelihood of read disturb. Also, Vpre-read2 provides the lower state memory cells among the selected memory cells in the conductive state and the higher state memory cells among the selected memory cells in a non-conductive state. Vpre-read1 provides the selected memory cells of all data states in the conductive state. During the pre-read operation, the duration of Vpre-read2 may be at least five, ten or twenty times as long as a duration of Vpre-read1.

During the read operation, the voltage on WLn−1 and WLn+1 increases directly from Vpre-read2 to Vpre-read1+ delta, e.g., from 4 V to 9 V. Also, the voltage on WL0-WLn-2 and WLn+2-WLlast increases directly from Vpre-read2 to 8 V (Vpre-read1), for instance. The voltage on SG_sel and WLdummy may be maintained at the same level during the pre-read and read operations, in one approach.

A method consistent with FIG. 15A-15H includes performing a pre-read operation for a set of memory cells in a NAND string. The performing the pre-read operation comprises providing a first positive gate-to-channel voltage (by applying Vpre-read1=8 V to the control gates via the word lines and biasing the channel to 1 V via the BL/SL) for the set of memory cells while biasing opposing ends of the NAND string with a positive voltage (1 V on the BL/SL), followed by providing a second positive gate-to-channel voltage (by applying Vpre-read2=4 V to the control gates via the word lines and biasing the channel to 1 V via the BL/SL)

for the set of memory cells. The second positive gate-to-channel voltage is lower than the first positive gate-to-channel voltage. The biasing of the opposing ends of the NAND string continues with the positive voltage during the applying of the second positive gate-to-channel voltage. The method further includes, upon completion of the pre-read operation, reading a selected memory cell in the NAND string while applying a turn on voltage (Vpre-read1=8 V) to unselected memory cells in the NAND string, wherein the turn on voltage is higher than a control gate voltage (Vpre-read2=4 V) of the second positive gate-to-channel voltage.

In one implementation, an apparatus comprises: a set of memory cells arranged in NAND strings and connected to a set of word lines, the set of memory cells comprises selected memory cells connected to a selected word line and adjacent unselected memory cells connected to an adjacent unselected word line, adjacent to the selected word line; and a control circuit configured perform a pre-read operation in preparation for a read operation, wherein in the pre-read operation the control circuit is configured to apply a voltage to the selected word line which provides the selected memory cells in a conductive state and apply a voltage to the adjacent unselected word line which provides the adjacent unselected memory cells in the conductive state, and in the read operation the control circuit is configured to apply a control gate read voltage to the selected word line while a determination is made as to whether the selected memory cells are in the conductive state and apply a voltage to the adjacent unselected word line which provides the adjacent unselected memory cells in the conductive state, wherein the voltage applied to the adjacent unselected word line in the read operation is greater than the voltage applied to the adjacent unselected word line in the pre-read operation.

In another implementation, a method comprises: performing a pre-read operation for a set of memory cells in a NAND string, the performing the pre-read operation comprises providing a first positive gate-to-channel voltage for the set of memory cells while biasing opposing ends of the NAND string with a positive voltage, followed by providing a second positive gate-to-channel voltage for the set of memory cells, lower than the first positive gate-to-channel voltage, while continuing the biasing of the opposing ends of the NAND string with the positive voltage; and upon completion of the pre-read operation, reading a selected memory cell in the NAND string while applying a turn on voltage to unselected memory cells in the NAND string, wherein the turn on voltage is higher than a control gate voltage of the set of memory cells during the second positive gate-to-channel voltage.

In another implementation, an apparatus comprises: a set of memory cells, the memory cells are arranged in NAND strings, each NAND string comprising a channel, the set of memory cells comprises a selected memory cell; means for performing a first pre-read operation followed by a first read operation for the selected memory cell; means for determining that the first read operation failed; and means for performing a second pre-read operation followed by a second read operation for the selected memory cell in response to the failed first read operation, a duration of the second pre-read operation is longer than a duration of the first pre-read operation.

The means for performing a first pre-read operation followed by a first read operation may include the controller 122, control circuitry 110, including the power control module 116 and pre-read and read parameter circuit 119, row decoder 124 and read/write circuits 128 of FIG. 1, or other logic hardware, and/or other executable code stored on a computer readable storage medium or device. Other embodiments may include similar or equivalent means.

The means for determining that the first read operation failed may include the controller 122, control circuitry 110, including the power control module 116, and read/write circuits 128, including the sense blocks, of FIG. 1, or other logic hardware, and/or other executable code stored on a computer readable storage medium or device. Other embodiments may include similar or equivalent means.

The means for performing a second pre-read operation followed by a second read operation may include the controller 122, control circuitry 110, including the power control module 116 and pre-read and read parameter circuit 119, row decoder 124 and read/write circuits 128 of FIG. 1, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings and connected to a set of word lines, the set of memory cells comprises selected memory cells connected to a selected word line and adjacent unselected memory cells connected to an adjacent unselected word line, adjacent to the selected word line; and
a control circuit configured perform a pre-read operation in preparation for a read operation, wherein in the pre-read operation the control circuit is configured to apply a voltage to the selected word line which provides the selected memory cells in a conductive state and apply a voltage to the adjacent unselected word line which provides the adjacent unselected memory cells in the conductive state, and in the read operation the control circuit is configured to apply a control gate read voltage to the selected word line while a determination is made as to whether the selected memory cells are in the conductive state and apply a voltage to the adjacent unselected word line which provides the adjacent unselected memory cells in the conductive state, wherein the voltage applied to the adjacent unselected word line in the read operation is greater than the voltage applied to the adjacent unselected word line in the pre-read operation.

2. The apparatus of claim 1, wherein:
the set of memory cells comprise non-adjacent unselected memory cells connected to a non-adjacent unselected word line, non-adjacent to the selected word line;
in the pre-read operation the control circuit is configured to apply a voltage to the non-adjacent unselected word line which provides the non-adjacent unselected memory cells in the conductive state;
in the read operation, the control circuit is configured to apply a voltage to the non-adjacent unselected word line which provides the non-adjacent unselected memory cells in the conductive state; and the voltage applied to the non-adjacent unselected word line in the pre-read operation is less than the voltage applied to the adjacent unselected word line in the read operation.

3. The apparatus of claim 2, wherein:
the voltage applied to the non-adjacent unselected word line in the read operation is equal to the voltage applied to the non-adjacent unselected word line in the pre-read operation.

4. The apparatus of claim 1, wherein:
the NAND strings extend vertically and comprise channels; and
the control circuit is configured to apply a positive voltage to opposing ends of the channels in the pre-read operation.

5. The apparatus of claim 4, wherein:
the NAND strings comprises select gate transistors at the opposing ends; and
in the pre-read operation the control circuit is configured to apply a voltage to the select gate transistors which provides the select gate transistors in the conductive state.

6. The apparatus of claim 1, wherein:
the NAND strings extend vertically and are formed in memory holes in a stack;
the memory holes have a diameter which increases with a height in the stack; and
in the pre-read operation, the voltage applied to the adjacent unselected word line is an increasing function of the height.

7. The apparatus of claim 1, wherein:
a duration of the pre-read operation is at least twice as long as a duration of the read operation.

8. The apparatus of claim 1, wherein in the pre-read operation:
the voltage which provides the selected memory cells in the conductive state is followed by a lower voltage which provides lower state memory cells among the selected memory cells in the conductive state and higher state memory cells among the selected memory cells in a non-conductive state; and
the voltage which provides the adjacent unselected memory cells in the conductive state is followed by a lower voltage which provides lower state memory cells among the adjacent unselected memory cells in the conductive state and higher state memory cells among the adjacent unselected memory cells in the non-conductive state.

9. The apparatus of claim 8, wherein in the pre-read operation:
a duration of the lower voltage which provides lower state memory cells among the selected memory cells in the conductive state is at least five times as long as a duration of the voltage which provides the selected memory cells in the conductive state.

10. The apparatus of claim 1, wherein:
the control circuit is configured to perform the pre-read operation and the read operation in response to an unsuccessful attempt to read the selected memory cells without uncorrectable errors.

11. The apparatus of claim 1, further comprising:
a timer which indicates a time which has passed since a last read of the set of memory cells without an uncorrectable error, the control circuit sets a duration of the pre-read operation as an increasing function of the time.

12. A method, comprising:
performing a pre-read operation for a set of memory cells in a NAND string, the performing the pre-read operation comprises providing a first positive gate-to-channel voltage for the set of memory cells while biasing opposing ends of the NAND string with a positive voltage, followed by providing a second positive gate-to-channel voltage for the set of memory cells, lower than the first positive gate-to-channel voltage, while continuing the biasing of the opposing ends of the NAND string with the positive voltage; and
upon completion of the pre-read operation, reading a selected memory cell in the NAND string while applying a turn on voltage to unselected memory cells in the NAND string, wherein the turn on voltage is higher than a control gate voltage of the second positive gate-to-channel voltage.

13. The method of claim 12, wherein:
the applying the turn on voltage to the unselected memory cells comprises applying a first turn on voltage to an adjacent memory cell, adjacent to the selected memory cell, and applying a second turn on voltage, lower than the first turn on voltage, to a non-adjacent memory cell, non-adjacent to the selected memory cell.

14. The method of claim 12, wherein:
a duration of the second positive gate-to-channel voltage is at least five times longer than a duration of the first positive gate-to-channel voltage.

15. The method of claim 12, further comprising:
performing the pre-read operation and the read operation in response to a failed attempt to read the selected memory cell.

16. The method of claim 12, further comprising:
setting a duration of the pre-read operation as an increasing function of a time since a last successful read of the NAND string.

17. An apparatus, comprising:
a set of memory cells, the memory cells are arranged in NAND strings, each NAND string comprising a channel, the set of memory cells comprises a selected memory cell;
means for performing a first pre-read operation followed by a first read operation for the selected memory cell;
means for determining that the first read operation failed; and
means for performing a second pre-read operation followed by a second read operation for the selected memory cell in response to the failed first read operation, a duration of the second pre-read operation is longer than a duration of the first pre-read operation.

18. The apparatus of claim 17, wherein:
the set of memory cells comprises an adjacent memory cell, adjacent to the selected memory cell and a non-adjacent memory cell, non-adjacent to the selected memory cell; and
a turn on voltage applied to the adjacent memory cell is greater than a turn on voltage applied to the non-adjacent memory cell during the second read operation.

19. The apparatus of claim 17, wherein:
the set of memory cells comprises an adjacent memory cell, adjacent to the selected memory cell; and
a turn on voltage applied to the adjacent memory cell is greater during the second read operation than during the second pre-read operation.

20. The apparatus of claim 17, wherein:
the second pre-read operation has a longer duration than the first pre-read operation.

\* \* \* \* \*